(12) United States Patent
Yu et al.

(10) Patent No.: US 12,191,279 B2
(45) Date of Patent: Jan. 7, 2025

(54) INTEGRATED CIRCUIT PACKAGES AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 461 days.

(21) Appl. No.: 17/542,516

(22) Filed: Dec. 6, 2021

(65) Prior Publication Data

US 2022/0093560 A1  Mar. 24, 2022

Related U.S. Application Data

(62) Division of application No. 16/518,992, filed on Jul. 23, 2019, now Pat. No. 11,195,816.

(51) Int. Cl.
*H01L 25/065* (2023.01)
*H01L 21/48* (2006.01)
(Continued)

(52) U.S. Cl.
CPC ...... *H01L 25/0652* (2013.01); *H01L 21/4857* (2013.01); *H01L 21/56* (2013.01); *H01L 23/3128* (2013.01); *H01L 23/3135* (2013.01); *H01L 23/3675* (2013.01); *H01L 23/5383* (2013.01); *H01L 23/5385* (2013.01); *H01L 25/50* (2013.01)

(58) Field of Classification Search
CPC . H01L 25/0652; H01L 21/4857; H01L 21/56; H01L 23/3128; H01L 23/3135; H01L 23/3675; H01L 23/5383; H01L 23/5385; H01L 25/50
See application file for complete search history.

(56) References Cited

U.S. PATENT DOCUMENTS 9,000,584 B2   4/2015  Lin et al.
9,048,222 B2   6/2015  Hung et al.
(Continued)

*Primary Examiner* — Kyoung Lee
*Assistant Examiner* — Christina A Sylvia
(74) *Attorney, Agent, or Firm* — JCIPRNET

(57) ABSTRACT

An integrated circuit package includes a package structure including a plurality of first dies, a second redistribution structure, a second die and a second encapsulant. The package structure includes the first dies, a first encapsulant encapsulating the first dies, a first redistribution structure over the first encapsulant and a plurality of conductive pillars over the first redistribution structure. The second redistribution structure is disposed over the package structure, and electrically connected to the package structure through the conductive pillars. The second die is disposed between the conductive pillars and electrically connected to the second redistribution structure, wherein a first surface of the second die is substantially flush with a surface of the first redistribution structure and a second surface opposite to the first surface of the second die is substantially flush with a surface of the second redistribution structure. The second encapsulant encapsulates the conductive pillars and the second die.

20 Claims, 24 Drawing Sheets

(51) Int. Cl.
*H01L 21/56* (2006.01)
*H01L 23/31* (2006.01)
*H01L 23/367* (2006.01)
*H01L 23/538* (2006.01)
*H01L 25/00* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0093572 A1* | 3/2016 | Chen .................. H01L 23/5389 438/126 |
| 2017/0194292 A1* | 7/2017 | Yu .......................... H01L 21/78 |
| 2018/0040547 A1* | 2/2018 | Zuo ........................ H01L 28/40 |
| 2018/0122764 A1* | 5/2018 | Chen ...................... H01L 24/01 |

* cited by examiner

INTEGRATED CIRCUIT PACKAGES AND METHODS OF FORMING THE SAME

CROSS-REFERENCE TO RELATED APPLICATION

This application is a divisional application of U.S. application Ser. No. 16/518,992, filed on Jul. 23, 2019. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuit (3DIC) packages, wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

DETAILED DESCRIPTION

Figure 1A:
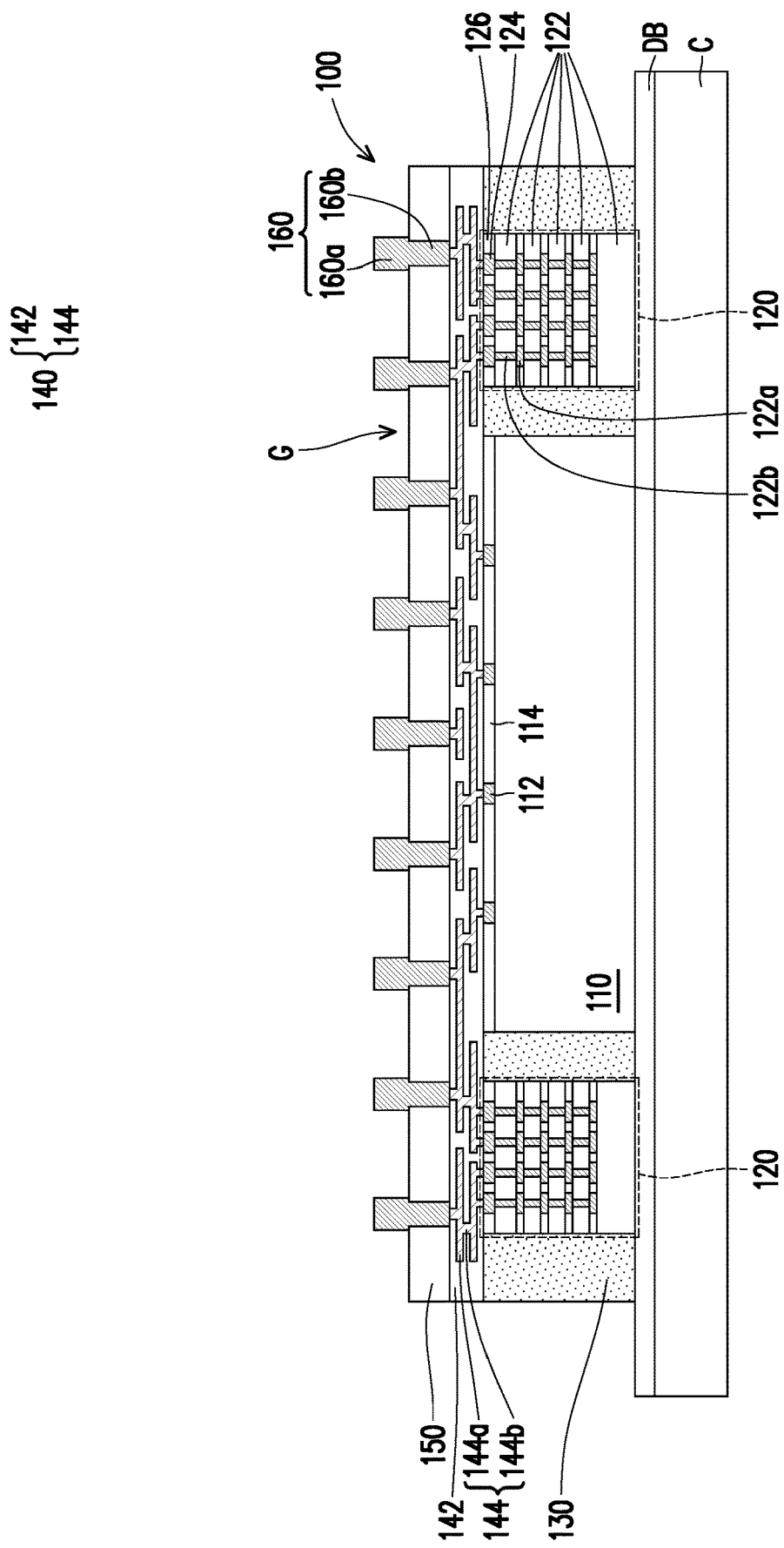
FIG. 1A to FIG. 1F are cross-sectional views of a method of forming an integrated circuit package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are cross-sectional views of a method of forming an integrated circuit package in accordance with some embodiments.

Referring to FIG. 1A, a package structure 100 is provided onto a carrier substrate C. In some embodiments, the package structure 100 is placed onto the carrier substrate C. The carrier substrate C may be a glass carrier. In some embodiments, a de-bonding layer DB is formed between the carrier substrate C and the package structure 100. The de-bonding layer DB is a light-to heat-conversion (LTHC) release layer, for example. The materials of the carrier substrate C and the de-bonding layer DB are not limited in this disclosure.

In some embodiments, the package structure 100 includes a plurality of integrated circuits 110, 120, an encapsulant 130, a redistribution layer structure 140, a substrate layer 150 and a plurality of conductive pillars 160. In some embodiments, the integrated circuit 110 is disposed between the integrated circuits 120, and the integrated circuit 110 is surrounded by the integrated circuits 120. In some embodiments, each of the integrated circuits 110 includes a logic die such as an application processor (AP) die, a central processing unit (CPU) die, a general processing unit (GPU) die, a field programmable gate arrays (FPGA) die, application-specific integrated circuit (ASIC) die, an I/O die, a network processing unit (NPU) die, a time processing unit (TPU) die, an artificial intelligence (AI) engine die, and a system on integrated chips (SoIC). In some embodiments, each of the integrated circuits 120 includes a memory die such as a high bandwidth memory (HBM) die, a static random access memory (SRAM) die, a dynamic random access memory (DRAM) die, a wide I/O memory die, a NAND memory die, a resistive random access memory (RRAM) die, a phase change random access memory (PRAM) die and a magnetic random access memory (MRAM) die, a SoC die, a SoIC die, a die stack or the like. In some embodiments, upon the process requirements, the dimension of the integrated circuit 120 is similar to or different from the dimension of the integrated circuit 110. The dimension may be a height, a width, a size, a top-view area or a combination thereof. In some embodiments, three integrated circuits are shown to represent plural integrated circuits, and the disclosure is not limited thereto. For example, there may be two integrated circuits or more than three integrated circuits.

In some embodiments, the integrated circuit 110 is different from the integrated circuit 120. In some embodiments, the integrated circuit 110 is a logic die, and the integrated circuits 120 is respectively memory die stacks or three-dimensional (3D) memory cubes. In some embodiments, the integrated circuit 120 has a plurality of dies 122. The dies 122 are stacked vertically and connected by micro-bumps 122a and/or through vias 122b of the dies 122, for example. In some embodiments, the integrated circuits 110 and 120 are connected to the redistribution layer 140 through the connector 112, 124 by flip chip bonding, hybrid bonding, fan-out RDL, and/or the like. In some embodiments, each of the integrated circuits 110, 120 has a plurality of connectors 112, 124 thereon and a dielectric layer 114, 126 aside the connectors 112, 124. In some embodiments, the connectors 112, 124 are copper pillars or other suitable metal pillars. In some embodiments, the dielectric layer 114, 126 is a polybenzoxazole (PBO) layer, a polyimide (PI) layer or other suitable underfilling epoxy polymers. In some alternative embodiments, the dielectric layer 114, 126 is made of inorganic materials. In some alternative embodiments, the integrated circuits 120 further include a controller. However, the structure of the integrated circuits 110, 120 are merely for illustration, and the disclosure is not limited thereto. For example, in some alternative embodiments, the connectors 112, 124 have solder layers (not shown) thereon, or the dielectric layer 114, 126 is omitted.

In some embodiments, the encapsulant 130 encapsulates the integrated circuits 110, 120. The encapsulant 130 is formed around the integrated circuits 110, 120. Specifically, the encapsulant 130 fills the gap between any two of the integrated circuits 110, 120. In some embodiments, the encapsulant 130 includes a molding compound, a resin or the like. In some embodiments, the encapsulant 130 includes a polymer material such as polybenzoxazole (PBO), polyimide, benzocyclobutene (BCB), a combination thereof, or the like. In alternative embodiments, the encapsulant 130 includes silicon oxide, silicon nitride or a combination thereof.

In some embodiments, the redistribution layer structure 140 is connected to surfaces of the integrated circuits 110, 120. The redistribution layer structure 140 includes a dielectric layer 142 and conductive features 144 embedded by the dielectric layer 142. The conductive features 144 are electrically connected to the connectors 112, 124 of the integrated circuits 110, 120. In some embodiments, the dielectric layer 142 includes a photo-sensitive material such as polybenzoxazole (PBO), polyimide (PI), benzocyclobutene (BCB), silicon oxide, and other inorganic dielectrics, a combination thereof or the like. In some embodiments, the dielectric layer 142 includes other dielectric material. In some embodiments, the conductive features 144 include metal lines 144a and/or metal vias 144b configured to electrically connect to different components. In some embodiments, the conductive features 144 include Cu, Ti, Ta, W, Ru, Co, Ni, a combination thereof or the like. In some embodiments, a seed layer and/or a barrier layer is disposed between each metal feature 144 and the dielectric layer 142. The seed layer may include Ti/Cu. The barrier layer may include Ta, TaN, Ti, TiN, CoW or a combination thereof. In some alternative embodiments, the metal features 144 are formed to form a redistribution layer structure such as serializer/deserializer (SerDes) redistribution layer structure.

In some embodiments, the substrate layer 150 is formed over the redistribution layer structure 140. In some embodiments, a material of the substrate layer 150 includes a semiconductor layer such as a silicon layer. In some embodiments, a lateral sidewall of the substrate layer 150 is substantially flush with lateral sidewalls of the encapsulant 130 and the redistribution layer structure 140. A thickness of the substrate layer 150 may range from 50 to 100 μm. In some alternative embodiments, the substrate layer 150 may be omitted.

Then, the conductive pillars 160 are formed in an on the substrate layer 150 to electrically connect the redistribution layer structure 140. In some embodiments, the conductive pillars 160 are copper pillars. In some embodiments, a plurality of openings in the substrate layer 150 to expose the conductive features 144, and then the conductive pillars 160 are formed in the openings and on the substrate layer 150 respectively. The conductive pillars 160 may be formed by a deposition process, a sputtering process, a plating process or the like and a sequential patterning process. In some embodiments, a shape of a top surface of the conductive pillars 160 is circle, square, rectangular, ellipse or the like. In some embodiments, the conductive pillars 160 penetrate the substrate layer 150 and protrude from the substrate layer 150. Specifically, the conductive pillars 160 have first portions 160a and second portions 160b connecting to the first portions 160a, the first portions 160a (for example, upper portions) are disposed on the substrate layer 150, and the second portions 160b (for example, lower portions) are embedded in the substrate layer 150. In some embodiments, the first portion 160a has a width larger than the second portion 160b. In some embodiments, the characteristic width of the first portion 160a of the conductive pillars 160 ranges from about 20 μm to 50 μm, and the width of the second portion 160b of the conductive pillars 160 ranges from about 5 μm to 15 μm. The height of the first portion 160a of the conductive pillar 160 may range from 30 μm to 300 μm. The thickness of the second portion is substantially equal to the thickness of the substrate layer 150. In some embodiments, a gap G is formed between the first portions 160a of the conductive pillars 160. In some embodiments, a width of the gap G is substantially the same, in other words, the conductive pillars 160 is arranged regularly. However, the invention is not limited thereto. In some alternative embodiments, the conductive pillars 160 is arranged irregularly. In some embodiments, depending on design needs, the width of the gap G ranges largely from 50 μm to 8000 μm.

Figure 1B:
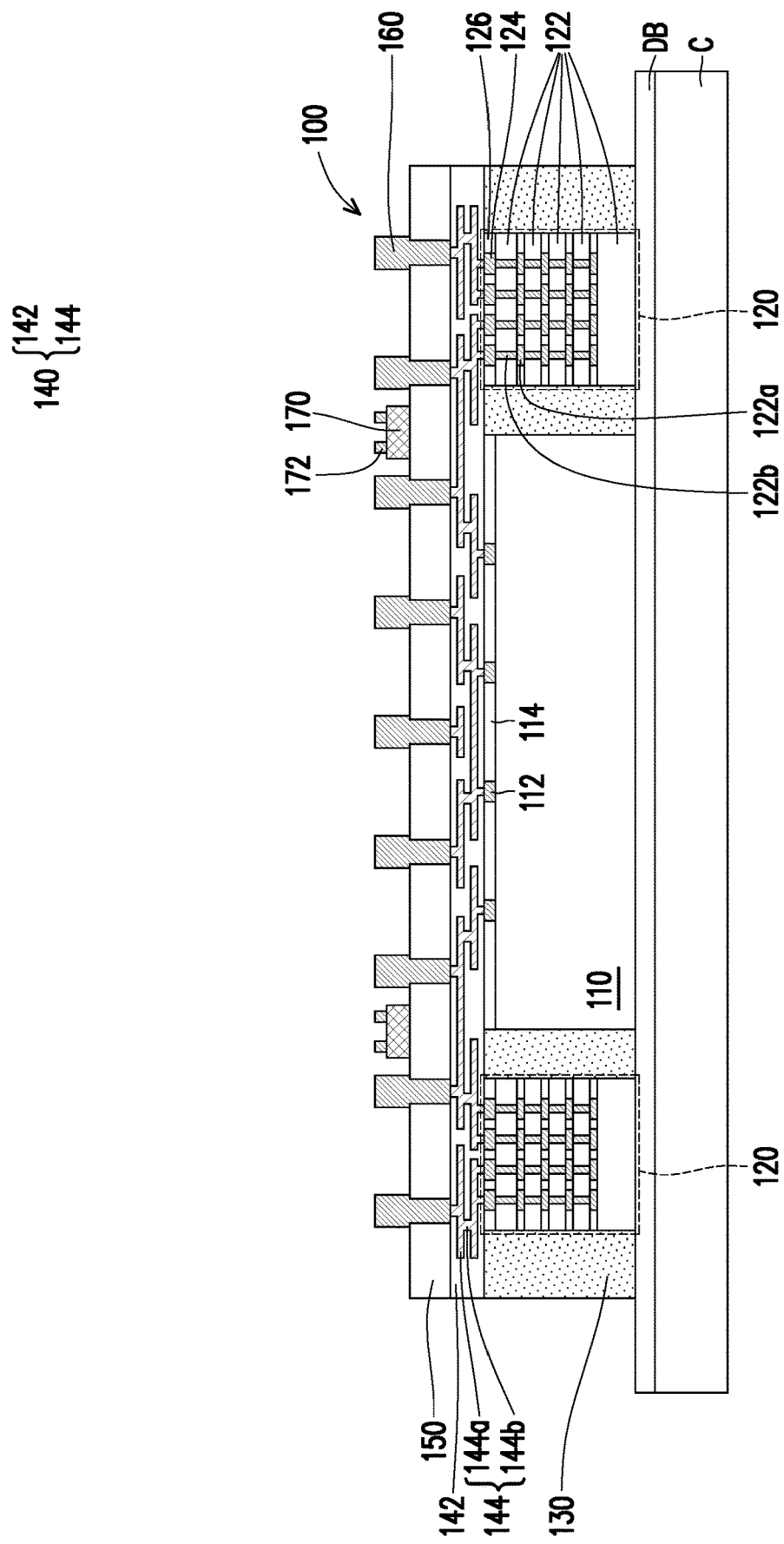

Referring to FIG. 1B, a plurality of dies 170 are formed over the package structure 100. In some embodiments, after the package structure 100 is disposed on the carrier substrate C, the dies 170 may be picked and placed onto the substrate layer 150. In some embodiments, the dies 170 are disposed in the gaps G between the conductive pillars 160 on the substrate layer 150. In some embodiments, the dies 170 are integrated passive device (IPD) dies, integrated voltage regulator (IVR) dies, memory dies, SerDes PHY dies, or the like. In some embodiments, depending on design needs, the dies 170 include dies of one function or multiple different functions, dies of same size or different sizes aforementioned. In some embodiments, the die 170 includes connectors 172 disposed thereon and extending away from the substrate layer 150. In some alternative embodiments, the die 170 is mounted onto the substrate layer 150 through an adhesive layer (not shown) such as a die attach film (DAF). In some alternative embodiments, the die 170 is mounted onto the substrate layer 150 through a metal bonding (not shown) such as flip chip bonding. In such embodiments, the connectors 172 of the die 170 may extend toward the substrate layer 150 and be electrically connected to the redistribution layer structure 140 via the conductive pillar 160. In some embodiments, a total height of the die 170 and the connector 172 thereon is in a range of 30 µm to 300 µm, and a width of the die 170 is in a range of 500 µm to 7500 µm. In some embodiments, top surfaces of the connectors 172 of the dies 170 are substantially coplanar with top surfaces of the conductive pillars 160. However, in some alternative embodiments, the top surfaces of the connectors 172 of the dies 170 are lower or higher than the top surfaces of the conductive pillars 160.

Figure 1C:
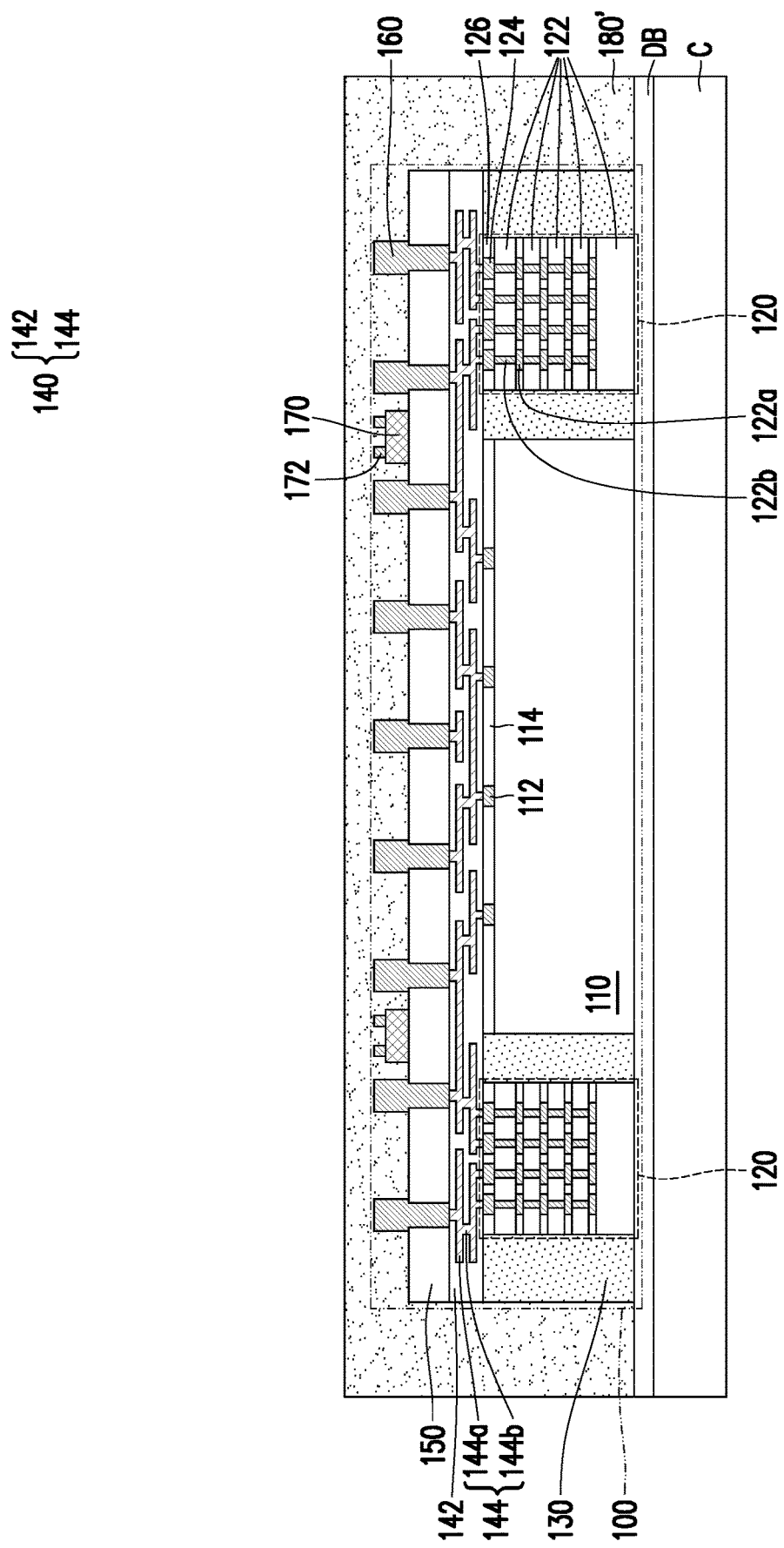
Figure 1D:
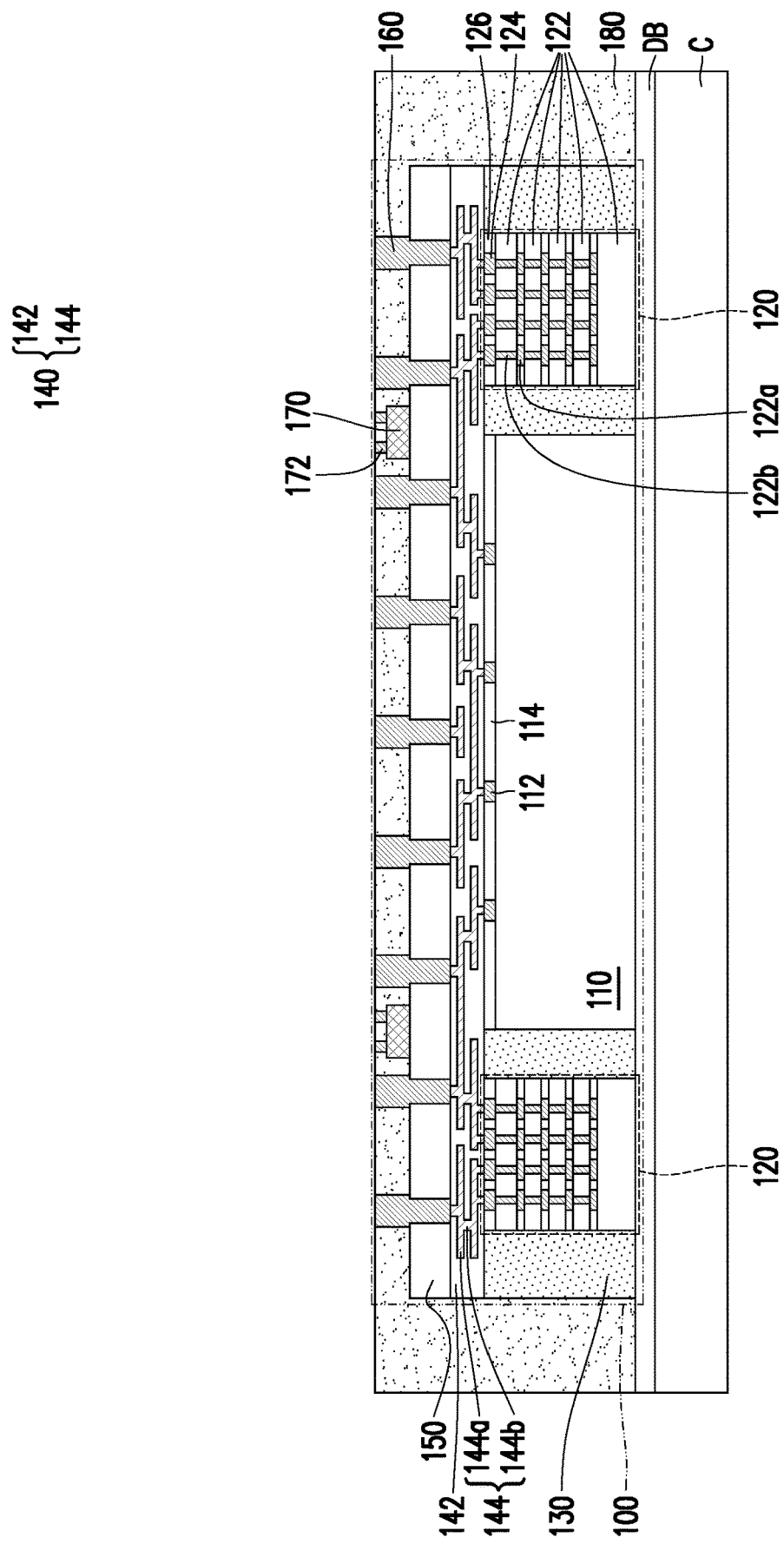

Referring to FIGS. 1C and 1D, an encapsulant 180 is formed over carrier substrate C to encapsulate the package structure 100 and the dies 170. In some embodiments, as shown in FIG. 1C, an insulating material 180' is formed over the carrier substrate C to cover the package structure 100 and the dies 170. In some embodiments, the insulating material 180' includes a molding compound such as an epoxy molding compound formed by a molding process. In some alternative embodiments, the insulating material 180' includes an epoxy, a resin or the like.

Then, as shown in FIG. 1D, the insulating material 180' is grinded until the conductive pillars 160 and the connectors 172 of the dies 170 are exposed, so as to form the encapsulant 180. In some embodiments, the insulating material 180' is grinded by a planarization process such as a chemical mechanical polish process. In some embodiments, after grinded, the top surfaces of the conductive pillars 160 and the connectors 172 are substantially coplanar with the top surface of the encapsulant 180. In some embodiments, the encapsulant 180 encapsulates the lateral sidewalls of the encapsulant 130, the redistribution layer structure 140, the substrate layer 150, the conductive pillars 160, the dies 170 and the connectors 172. The top surfaces of the conductive pillars 160 and the connectors 172 of the dies 170 are exposed by the encapsulant 180. In other words, the conductive pillars 160 and the dies 170 are embedded in the encapsulant 180 with the exposed top surfaces. In some embodiments, the conductive pillars 160 and the dies 170 are encapsulated and in contact with the encapsulant 180. The conductive pillars 160 and the connectors 172 may be disposed in and penetrate the encapsulant 180. In some alternative embodiments, the encapsulant 180 is formed by a lamination process.

Figure 1E:
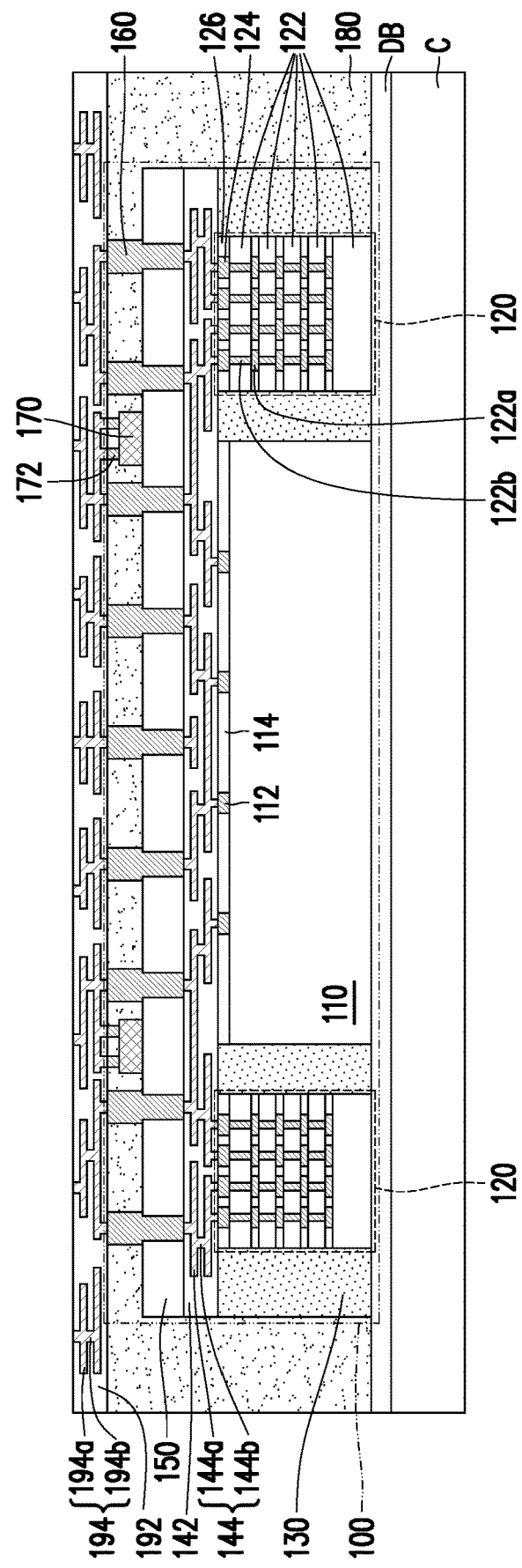

Referring to FIG. 1E, after forming the encapsulant 180, a redistribution layer structure 190 is formed over the encapsulant 180 and electrically connected to the conductive pillars 160 and the dies 170. In some embodiments, the redistribution layer structure 190 includes a plurality of dielectric layers 192 and a plurality of conductive features 194 embedded in the dielectric layers 192. It is noted that numbers of layers of the conductive features 194 are shown for illustration purpose, and the scope of the disclosure is not limited thereto. In some embodiments, the dielectric layer 192 is a multi-layer structure. In some embodiments, the dielectric layer 192 includes a photo-sensitive material such as polybenzoxazole (PBO), polyimide (PI), benzocyclobutene (BCB), a combination thereof or the like. In some embodiments, the dielectric layer 192 includes other dielectric material. In some embodiments, the conductive features 194 include metal lines 194a and/or metal vias 194b configured to electrically connect to different components. In some embodiments, the conductive features 194 include Cu, Ti, Ta, W, Ru, Co, Ni, a combination thereof or the like. In some embodiments, a seed layer and/or a barrier layer is disposed between each conductive feature 194 and the dielectric layer 192. The seed layer may include Ti/Cu. The barrier layer may include Ta, TaN, Ti, TiN, CoW or a combination thereof.

In some embodiments, a thickness of the dielectric layer 192 is in a range of 10 µm to 30 µm. In some embodiments, the conductive features 194 have a linewidth ranging from 2 µm to 10 µm. In some alternative embodiments, the linewidth of the conductive features 194 is increased as the conductive features 194 becomes closer to the redistribution layer structure 200 (shown in FIG. 1F). In some alternative embodiments, the linewidth of the conductive features 194 is substantially the same or larger than the linewidth of the underlying conductive features 194. In some embodiments, the linewidth is referred to as a critical dimension or a pitch.

Figure 1F:
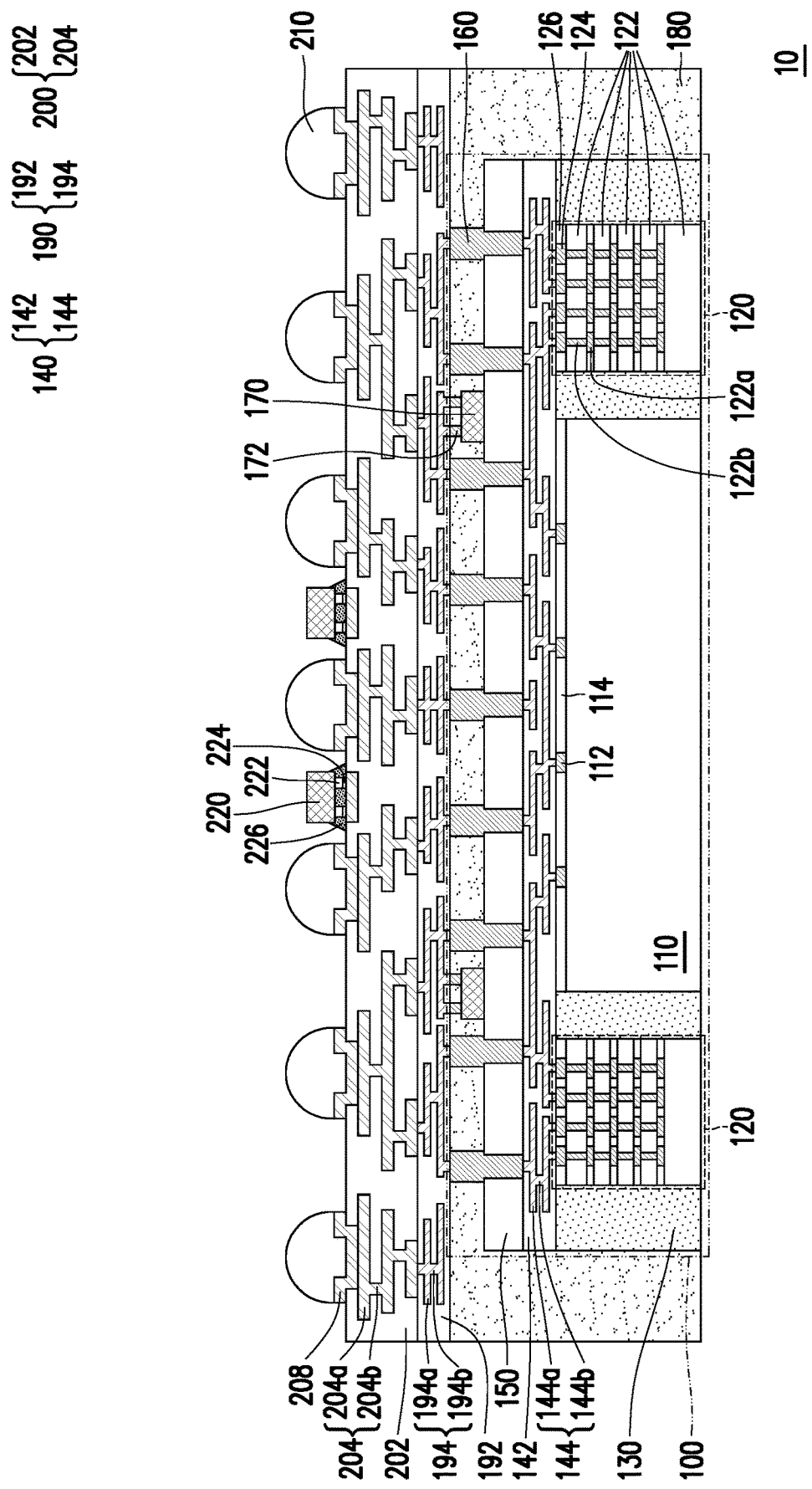

Referring to FIG. 1F, a redistribution layer structure 200 is formed over the redistribution layer structure 190 and electrically connected to the conductive pillars 160 and the dies 170. In some embodiments, the redistribution layer structure 200 includes a plurality of dielectric layers 202 and a plurality of conductive features 204 embedded in the dielectric layers 202. In some embodiments, the conductive features 204 include metal lines 204a and/or metal vias 204b configured to electrically connect to different components. It is noted that numbers of layers of the conductive features 204 are shown for illustration purpose, and the scope of the disclosure is not limited thereto.

In some embodiments, the main function of the redistribution layer structure 200 is to provide electrical connection to the conductive terminals and structure rigidity of an integrated circuit package 10. Thus, the machine, the method and the material for fabricating the redistribution layer structure 200 may be different from those for fabricating the redistribution layer structure 190. In some embodiments, a photoresist layer is formed on the redistribution layer structure 190 by lamination and/or coating process. After image patterning, the metal lines 204a and the metal via 204b are formed by electrical plating process. Then, the photoresist layer is removed and undesired seed layer is removed by a dry and/or wet etch process. To strengthen the structure rigidity, an enhanced encapsulant material is applied to fill up the metal lines and metal vias by an encapsulation process. In some embodiments, the enhanced encapsulant materials is an epoxy based polymers with fine grain of inorganic fillers (0.5 µm~2 µm) and volume fraction of 30%-80%. In some embodiments, the encapsulation process includes wafer molding, wafer dispensing, wafer lamination, and the like. After encapsulation, a planarization process is applied to remove the excess encapsulant to expose the metal lines. The same steps are repeated to form multiple layers of the redistribution layer structure 200. In some embodiments, a thick dielectric layer is formed on the structure 190, then metal via and metal lines are formed at one time by laser imaging process (LDI). In some embodiments, the thick dielectric layer includes Ajinomoto Buildup Film (ABF), polyimide, and the like. For metal formation, a conformal seed layer is formed first by an electroless process, then metal vias and the metal lines are formed by electroplating. Finally, a metal planarization is needed to remove the metal overburden. In some embodiments, the metal layer includes Cu, Ti, Ta, W, Ru, Co, Ni, a combination thereof or the like. In some embodiments, the metal planarization includes method of CMP, wheel grinding, diamond blade fly cut, and the like. In such way, a dual damascene like redistribution layer is formed. The same steps are repeated to form multiple layer s of the redistribution layer structure 200.

In some embodiments, a linewidth of the conductive features 204 is larger than a linewidth of the conductive features 194. In some embodiments, the linewidth of the conductive features 204 is at least 1.5, 2, 3, 4, 5, 6, 7, 8, 9 or 10 times of the linewidth of the conductive features 194. In some embodiments, the linewidth of the conductive features 204 is in a range of 20 μm to 50 μm. In some alternative embodiments, the linewidth of the conductive features 204 is increased as the conductive features 204 becomes closer to conductive terminals 210. In some alternative embodiments, the linewidth of the conductive features 204 is substantially the same or larger than the linewidth of the underlying conductive features 204. For example, the linewidth of the conductive features 204 is substantially the same or larger than the linewidth of the conductive features 204b therebeneath. In some embodiments, a thickness of the dielectric layer 202 is larger than a thickness of the dielectric layer 192. The thickness of the dielectric layer 202 may be in a range of 50 μm to 150 μm. In some embodiments, the redistribution layer structure 200 provides a high modulus for support such as in a range of 1 GPa to 10 GPa.

In some embodiments, the redistribution layer structure 200 is formed by the process such as LDI which is generally used to manufacture the PCB, and thus the redistribution layer structure 200 has good rigidity. In addition, the cost and the time of the manufacture for the redistribution layer structure 200 are reduced. Furthermore, compared with the printed circuited board having a core layer, the redistribution layer structure 200 is directly formed over and integrated onto the package structure 100 and the encapsulant 180, and thus a support substrate similar to the core layer is not needed. Accordingly, a total thickness of the integrated circuit package 10 is smaller than the integrated circuit package having the package structure bonded to the printed circuited board. Moreover, the connectors such as controlled collapse chip connection (C4) bumps between the package structure and the printed circuit board are not required.

After forming the redistribution layer structure 200, a plurality of conductive terminals 210 are formed on the redistribution layer structure 200. In some embodiments, the conductive terminals 210 are ball grid array (BGA) connectors, solder balls, metal pillars, and/or the like. In some embodiments, the conductive terminals 210 are formed by a mounting process and a reflow process. In some embodiments, a plurality of under-ball metallurgy (UBM) patterns 208 are formed under the conductive terminals 210 for ball mount.

In some embodiments, a plurality of dies 220 are mounted on the redistribution layer structure 200 between the conductive terminals 210. At this point, the integrated circuit package 10 is fabricated. In some embodiments, the dies 220 are IPD dies, IVR dies, memory dies or the like. In some embodiments, the die 220 includes connectors 222 thereon. In some embodiments, the dies 220 are mounted onto the redistribution layer structure 200 through the connectors 222 and solders 224. In some embodiments, an underfill 226 is provided between the die 220 and the redistribution layer structure 200 to seal the region therebetween. However, in some alternative embodiments, the die 220 is a bare (unpackaged) die.

In some embodiments, the integrated circuit package 10 is separated from the carrier substrate C. That is, the carrier substrate C is removed. In some embodiments, the debonding layer DB is irradiated by an UV laser such that the integrated circuit package 10 is peeled from the carrier substrate C. In some alternative embodiments, after the conductive terminals 210 and the dies 220 are formed, a singulation process is performed to form a single integrated circuit package. In some embodiments, the integrated circuit package 10 is provided in a high-performance computing system, to provide high data transmission rate. In some embodiments, a dimension of the integrated circuit package 10 is larger than 40 mm×40 mm. In some embodiments, the integrated circuit package 10 is an integrated fan-out package.

In some embodiments, the package structure 100 is connected to the conductive terminals 210 through the conductive pillars 160 and the redistribution layer structures 190, 200 therebetween. Since the conductive pillars 160 and the redistribution layer structures 190, 200 are directly formed over the package structure 100, the bonding of the package structure 100 to an additional circuit board and the formation of additional bumps (such as C4 bumps) between the additional circuit board and the package structure are not required. In addition, the dies 170 such as IPD dies, memory dies, SerDes dies, and/or IVR dies are disposed between the conductive pillars 160 and embedded in the encapsulant 180, and thus the integration of the integrated circuit package 10 is improved. Furthermore, in some embodiments, the logic die and the memory dies (such as 3D memory cube) is integrated to realize near in-memory computing (IMC) technology with high computing efficiency, high bandwidth and low latency.

Figure 3:
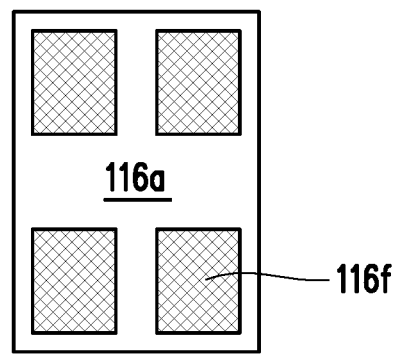
FIG. 3 is a top view of an integrated circuit package of FIG. 2D to FIG. 2F.
Figure 4:
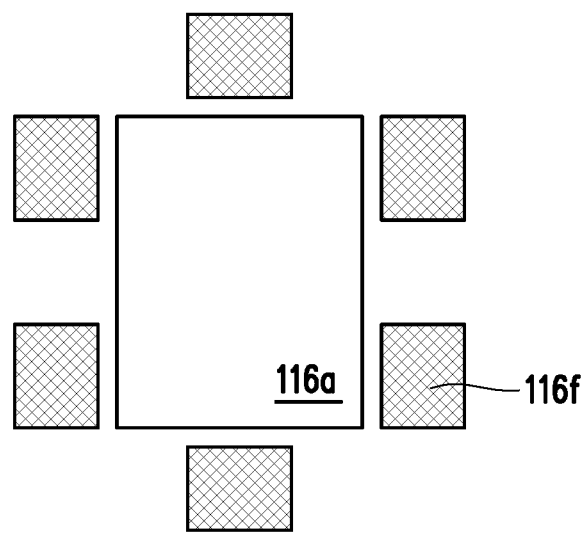
FIG. 4 is a top view of an integrated circuit package of FIG. 2G to FIG. 2I.
Figure 5:
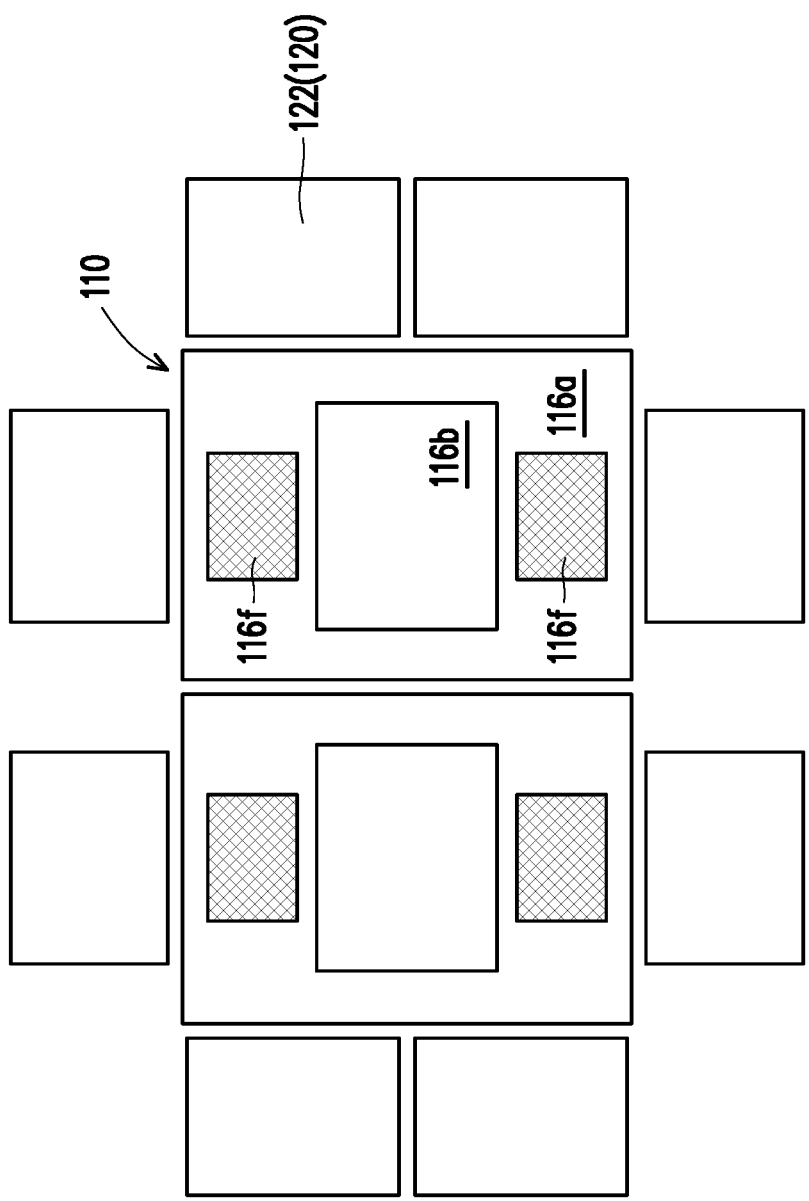
FIG. 5 is a top view of an integrated circuit package in accordance with some embodiments.

FIG. 2A to FIG. 2I are cross-sectional views of integrated circuit packages in accordance with some embodiments. FIG. 3 is a top view of an integrated circuit package of FIG. 2D to FIG. 2F. FIG. 4 is a top view of an integrated circuit package of FIG. 2G to FIG. 2I. FIG. 5 is a top view of an integrated circuit package in accordance with some embodiments. The semiconductor packages 10A-10I illustrated in FIGS. 2A to 2I are similar to the semiconductor package 10 illustrated in FIG. 1F, hence the same reference numerals are used to refer to the same and liked parts, and its detailed description will be omitted herein. The difference between the semiconductor package 10A-10I and the semiconductor package 10 is the structure of the integrated circuit 110. In the embodiment shown in FIGS. 2A to 2I, the integrated circuit 110 is a system on integrated chips (SoIC).

Figure 2A:
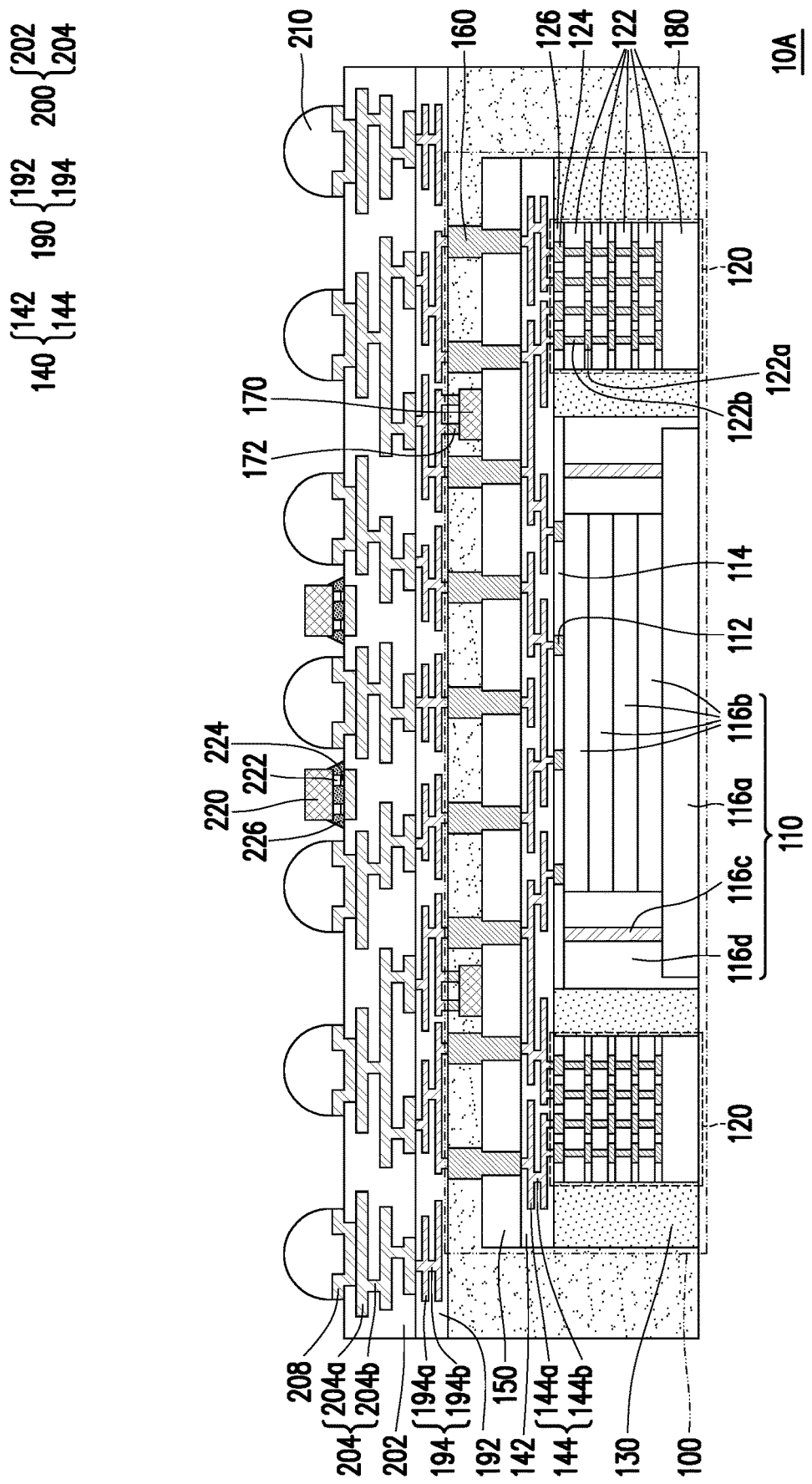
FIG. 2A to FIG. 2I are cross-sectional views of integrated circuit packages in accordance with some embodiments.
Figure 2B:
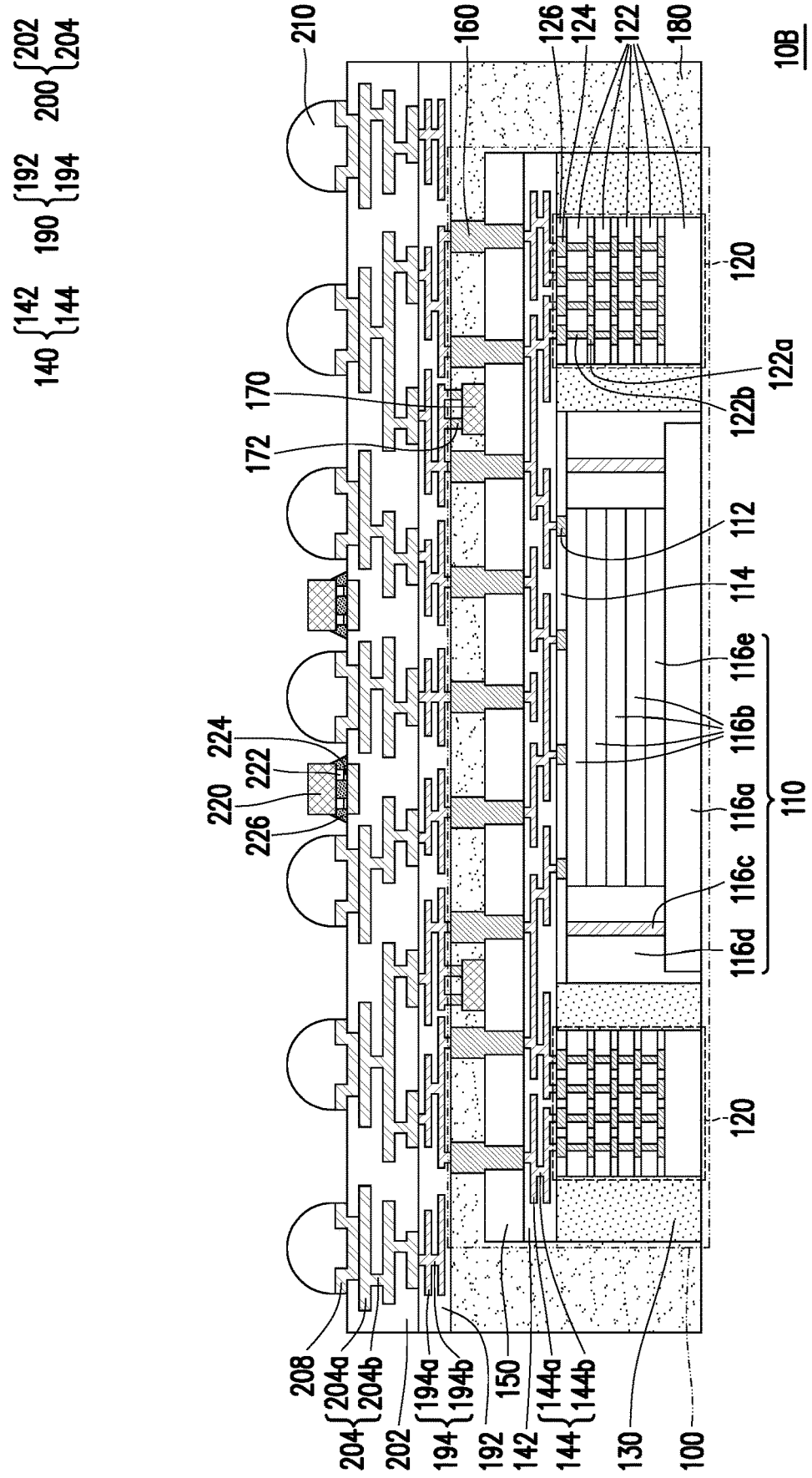
Figure 2C:
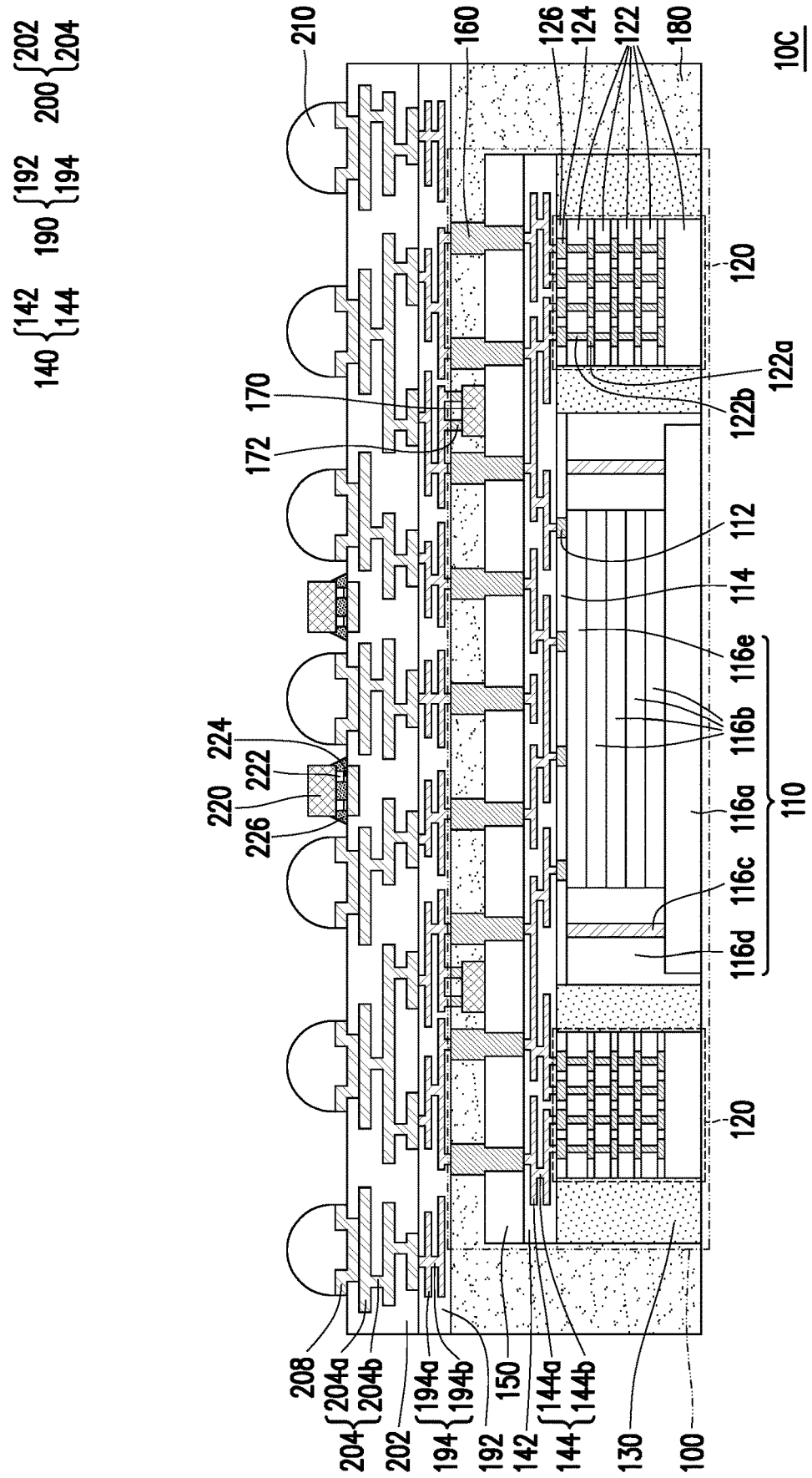
Figure 2D:
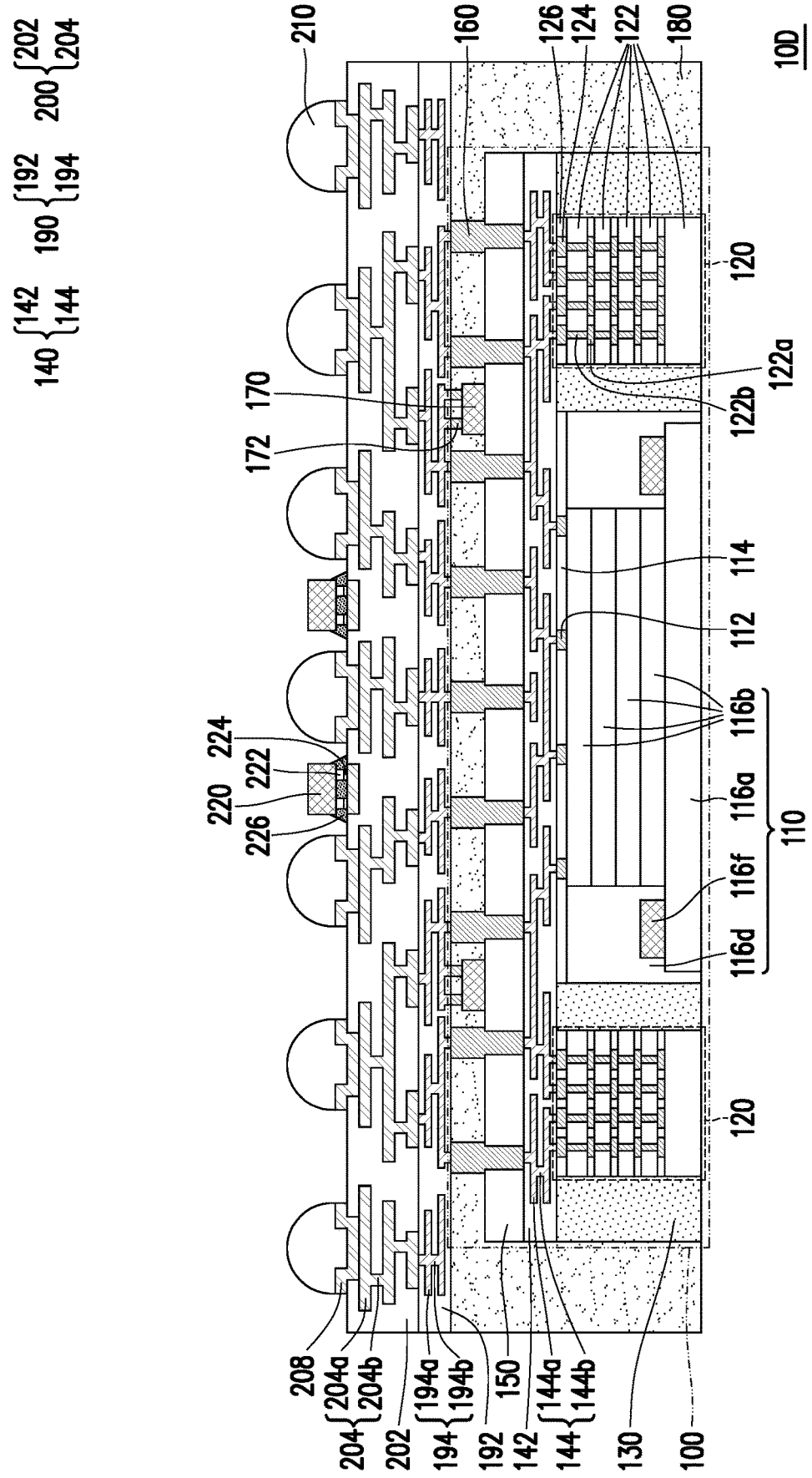
Figure 2E:
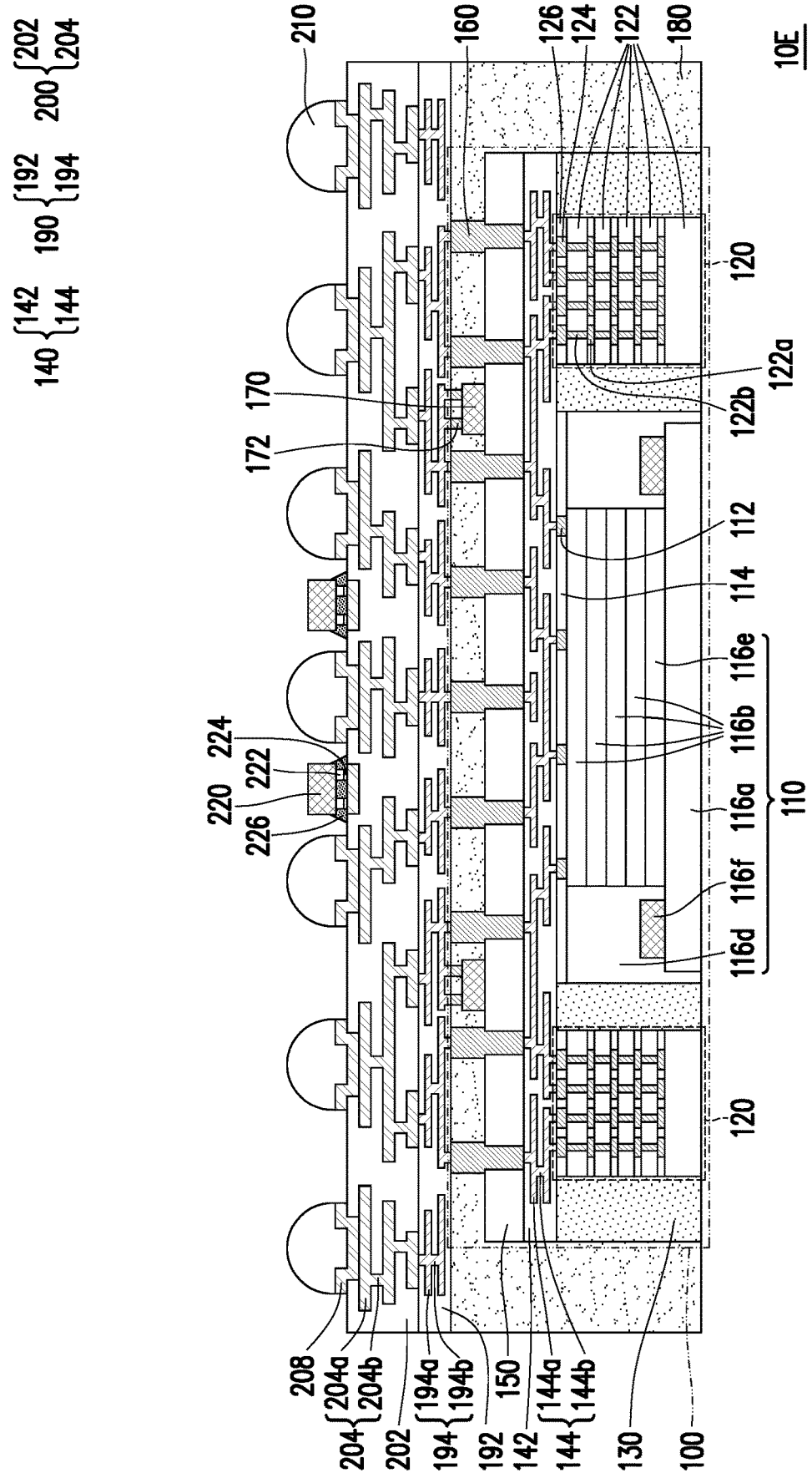
Figure 2F:
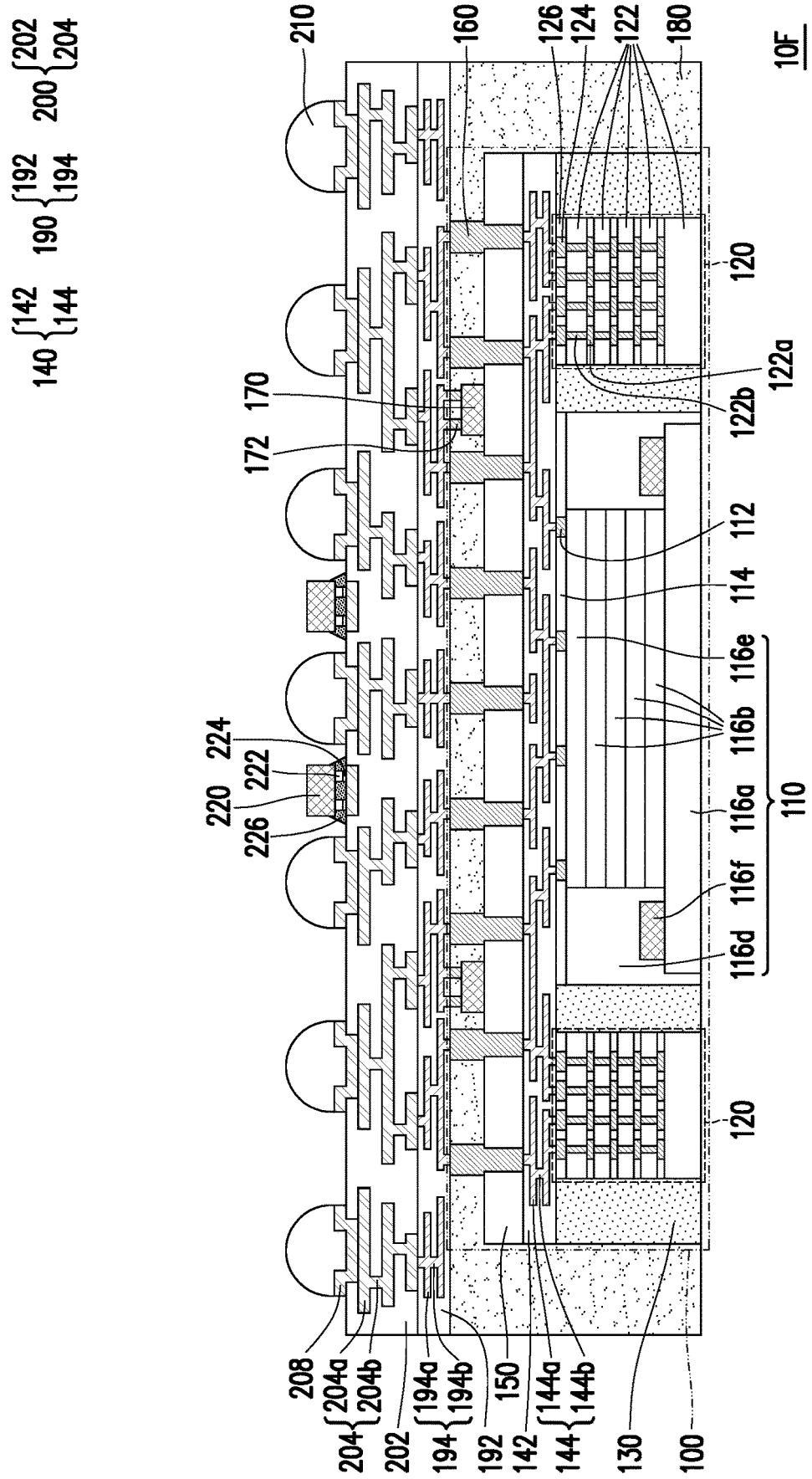
Figure 2G:
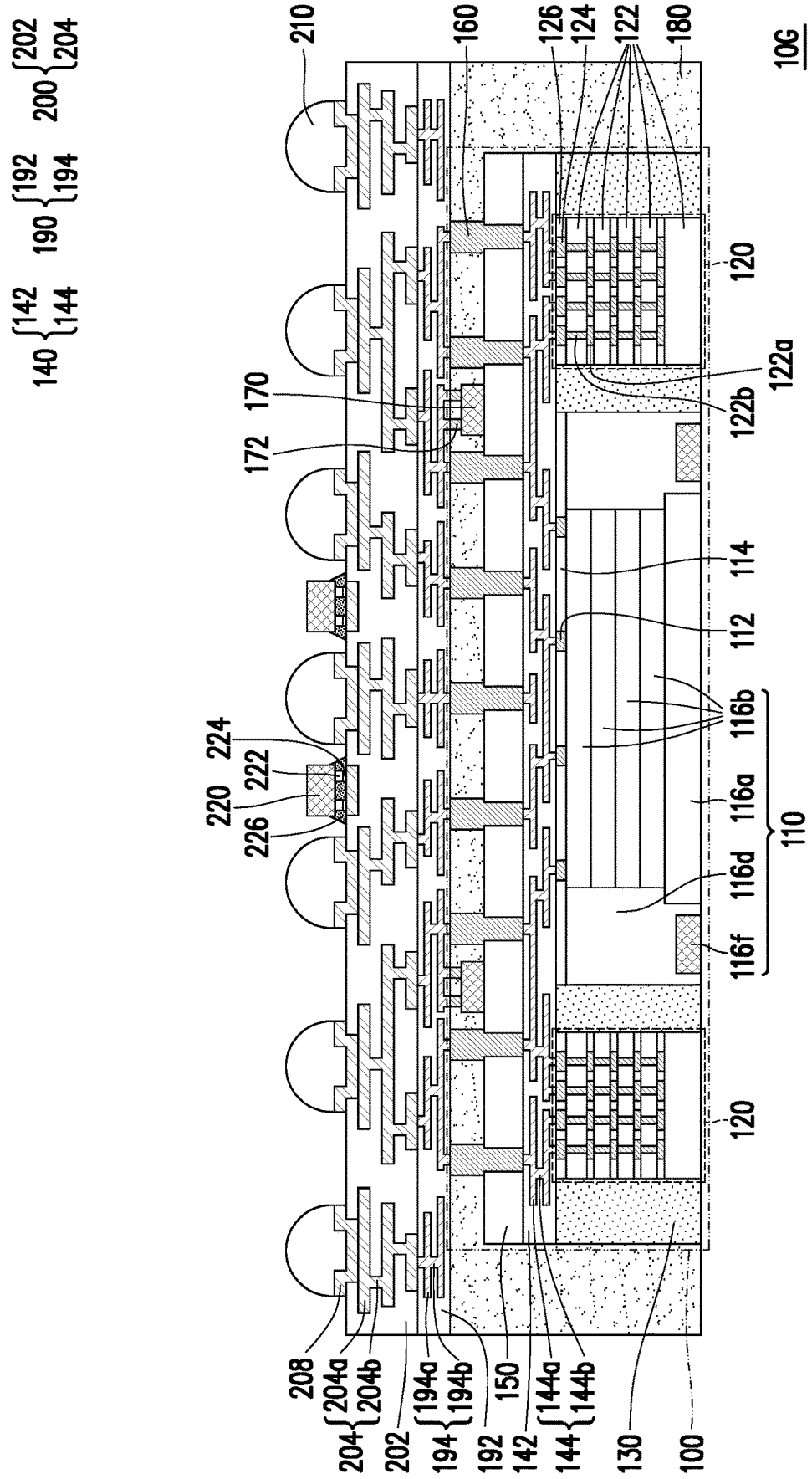
Figure 2H:
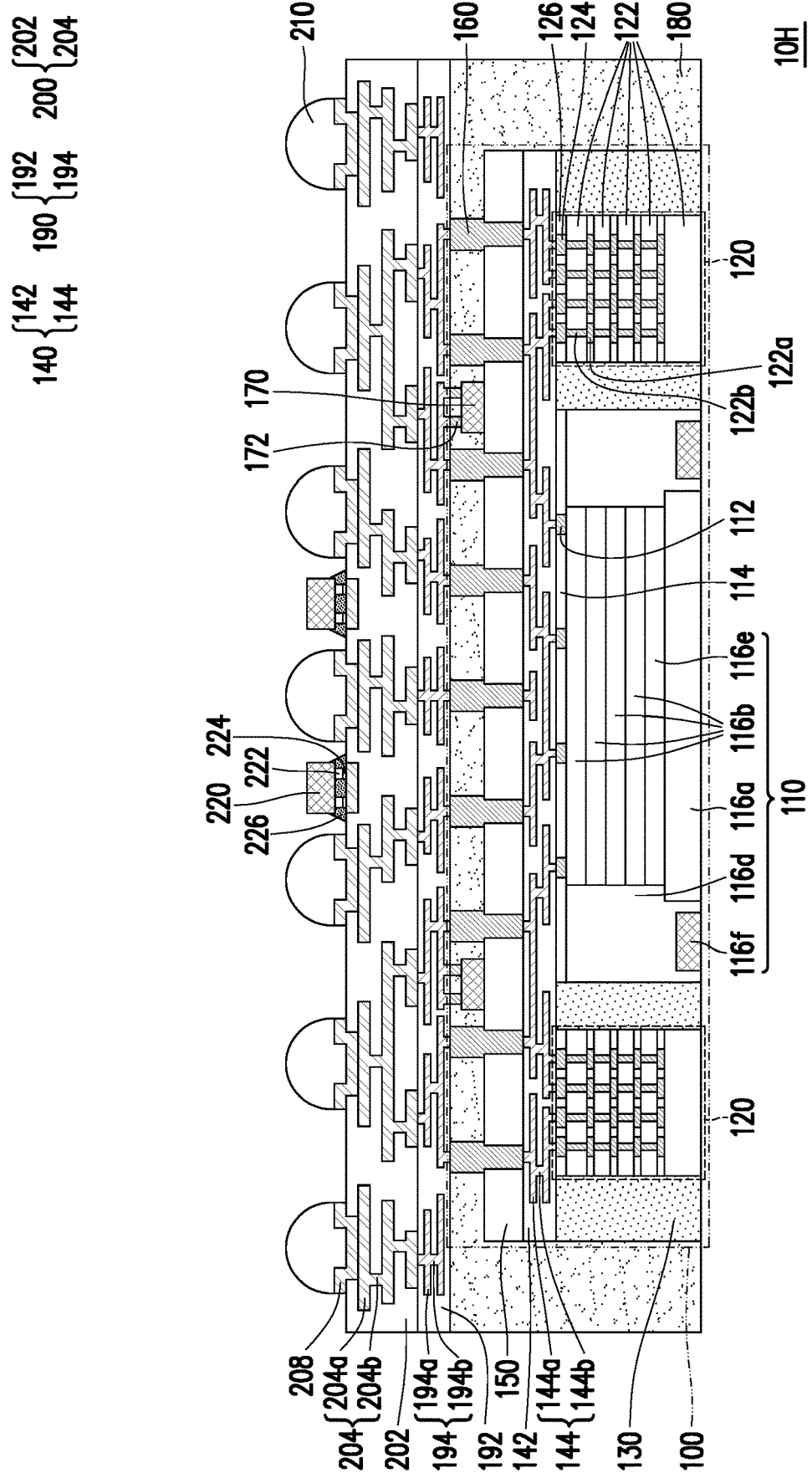
Figure 2I:
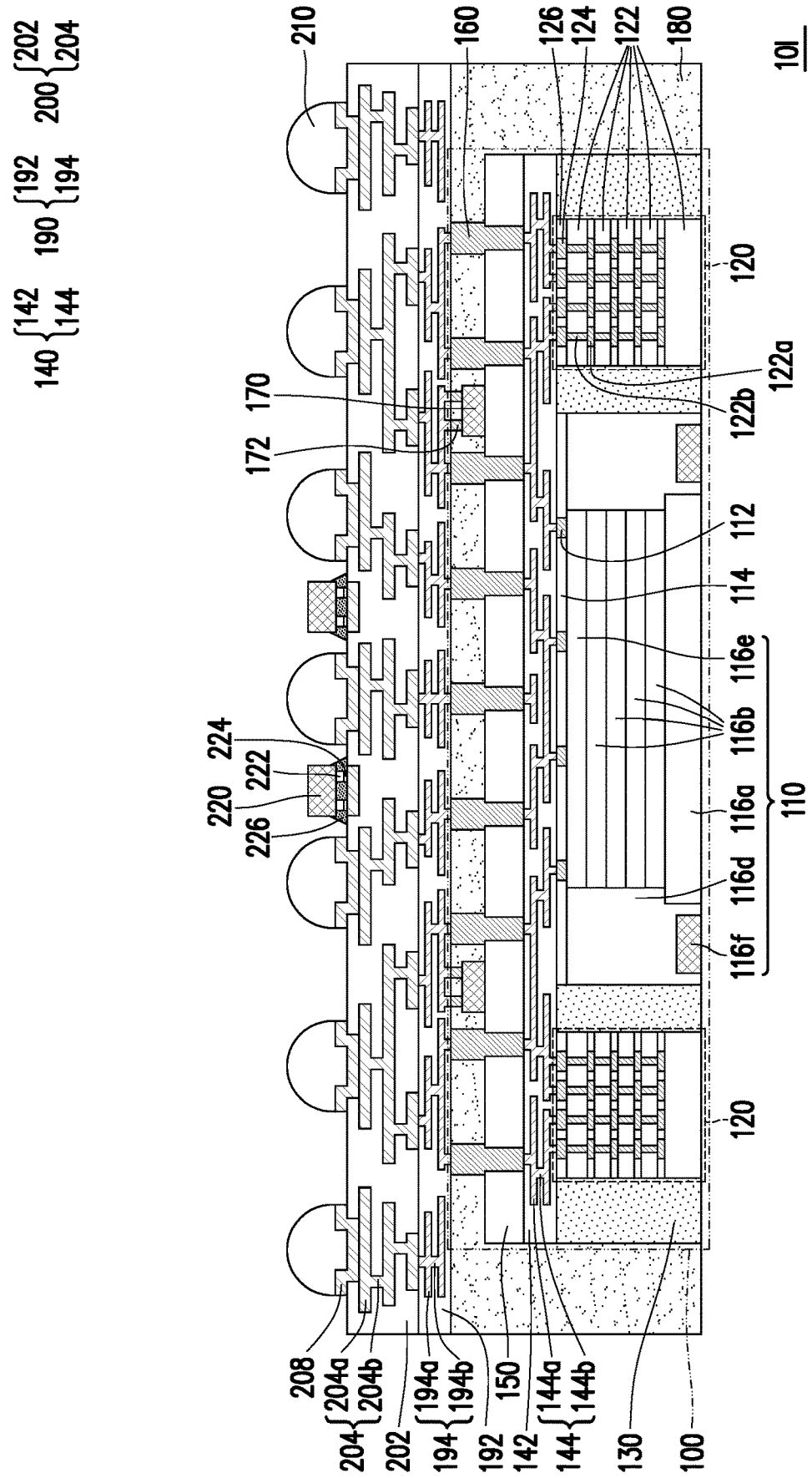

In detail, in the embodiments shown in FIGS. 2A to 2C, the integrated circuit 110 includes a first die 116a, a plurality of second dies 116b, a plurality of conductive pillars 116c, and an encapsulant 116d. In some embodiments, the second dies 116b are sequentially stacked on the first die 116a to form a die stack. In some embodiments, the second dies 116b are stacked on the first die 116a vertically and connected to each other by micro-bumps (not shown) and/or through vias (not shown) of the second dies 116b. In some embodiments, the first die 116a is a logic die such as a SoC die, and the second dies 116b are memory dies such as SRAM dies. In some embodiments, the die stack of second dies 116b is different from the die stack of the integrated circuit 120, in other words, the package structure 100 includes at least two different memory cubes. In some embodiments, the conductive pillars 116c are disposed on the first die 116a aside the second dies 116b. The encapsulant 116d is formed on the first die 116a to encapsulate the second dies 116b and the conductive pillars 116c. In some embodiments, the conductive pillars 116c are disposed in and penetrate the encapsulant 116d. The conductive pillars 116c are thermal pillars for heat spreading, vertical interconnect for I/O communication, and the like.

In the embodiments shown in FIGS. 2B and 2C, the integrated circuit 110 further includes a third die 116e. In some embodiments, the third die 116e is a logic die such as a SoC die. In some embodiments, the third die 116e is a memory controller logic, an I/O logic, a digital signal processing (DSP), an IPD die, and a logic core or the like.

In some embodiments, the third die 116e is itself a stacked die of multiple logic cores and I/O die or the like. In some embodiments, the third die 116e is itself a SoIC of multiple stacked logic cores and I/O die or the like. In some embodiments, the third die 116e has the same size as the dies 116b. In some embodiments, the third die 116e has a different size from the dies 116b. In detail, in the embodiment shown in FIG. 2B, the third die 116e is disposed between the first die 116a and the second dies 116b, that is, the third die 116e is disposed adjacent to the first die 116a. However, the invention is not limited thereto. In the embodiment shown in FIG. 2C, the third die 116e is disposed on the second dies 116b over the first die 116a, in other words, the third die 116e is disposed opposite to the first die 116a with respect to the second dies 116b.

In the embodiments shown in FIGS. 2D to 2I, the integrated circuit 110 includes a first die 116a, a plurality of second dies 116b, an additional die 116f, and an encapsulant 116d. The additional die 116f may be an IPD die, an IVR die or the like. The additional die 116f may be a bare (unpackaged) die mounted on the periphery surface of the first die 116a. In some embodiments, the additional die 116f is bonded to the first die 116a with a face-to-face direct bonding. In some alternative embodiments, an underfill (not shown) is provided between the additional die 116f and the first die 116a to seal the region therebetween. In the embodiments shown in FIGS. 2D to 2F and 3, the additional die 116f is disposed on the first die 116a aside the second dies 116b. The encapsulant 116d is formed on the first die 116a to encapsulate the second dies 116b and the additional die 116f. In some embodiments, as shown in FIGS. 2G to 2I and FIG. 4, the additional dies 116f is disposed aside and separated from the first die 116a. In some embodiments, the additional die 116f is deposited in a face-up manner with a die attach film and use vertical connectors (not shown) to connect to the redistribution layer structure 140. The encapsulant 116d is formed to encapsulate the first die 116a, the second dies 116b and the additional die 116f. In addition, in the embodiments shown in FIGS. 2E, 2F, 2H and 2I, a third die 116e is disposed between the first die 116a and the second dies 116b or on the second dies 116b over the first die 116a.

In above embodiments, one integrated circuit 110 is shown. However, the invention is not limited thereto. For example, in the embodiment shown in FIG. 5, a plurality of integrated circuits 110 is disposed between the integrated circuits 120. In addition, each of the integrated circuits 110 may include a first die 116a, a plurality of second dies 116b and a plurality of additional dies 116f, and the second dies 116b and the additional dies 116f are disposed on the first die 116a. The integrated circuits 120 may respectively include a plurality of dies 122 (i.e., a die stack). Therefore, as shown in FIG. 5, the first dies 116a are surrounded by the dies 122 (i.e., a die stack), and the second dies 116b is surrounded by the additional dies 116e. In the embodiment, the first dies 116a are logic dies, the dies 116b, 122 are memory dies, and the additional dies 116f are IPD dies and/or IVR dies. Accordingly, the logic dies may be surrounded by the memory dies, and IPD die and/or IVR die may be disposed between the memory dies.

Figure 6:
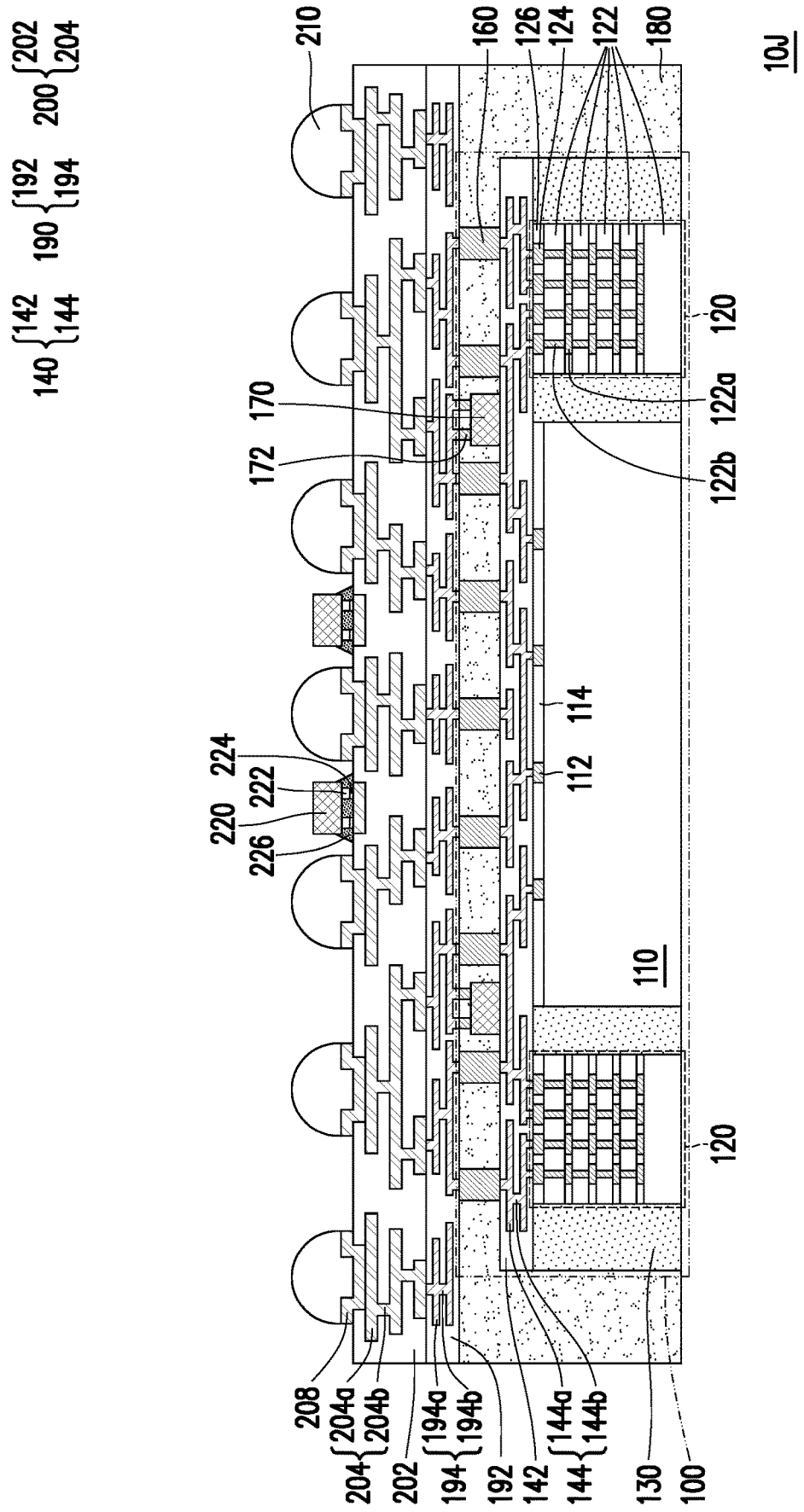
FIG. 6 is a cross-sectional view of an integrated circuit packages in accordance with some embodiments.

FIG. 6 is a cross-sectional view of an integrated circuit packages in accordance with some embodiments. The semiconductor package 10J illustrated in FIG. 6 is similar to the semiconductor package 10 illustrated in FIG. 1F, hence the same reference numerals are used to refer to the same and liked parts, and its detailed description will be omitted herein. The difference between the semiconductor package 10J and the semiconductor package 10 is the substrate layer 150. For example, in the embodiment shown in FIG. 1F, the semiconductor package 10 includes the substrate layer 150. However, in the embodiment shown in FIG. 6, the conductive pillars 160 of semiconductor package 10J are directly formed on the redistribution layer structure 140 without a substrate layer 150 therebetween. In some embodiments, the integrated circuits 110 and 120 are connected to the redistribution layer 140 through the connector 112, 124 by flip chip bonding, hybrid bonding, fan-out RDL and/or the like. In detail, as shown in FIG. 6, the conductive pillar 160 has a top width substantially the same as a bottom width. In the embodiment, a lateral sidewall of the conductive pillar 160 is entirely encapsulated by the encapsulant 180. In some embodiments, if required, the redistribution layer structure 190 is a serializer/deserializer (SerDes) redistribution layer structure. In addition, in some alternative embodiments, the package structure 100 is any one of the package structures of FIGS. 1, 2A-2I or the like.

Figure 7:
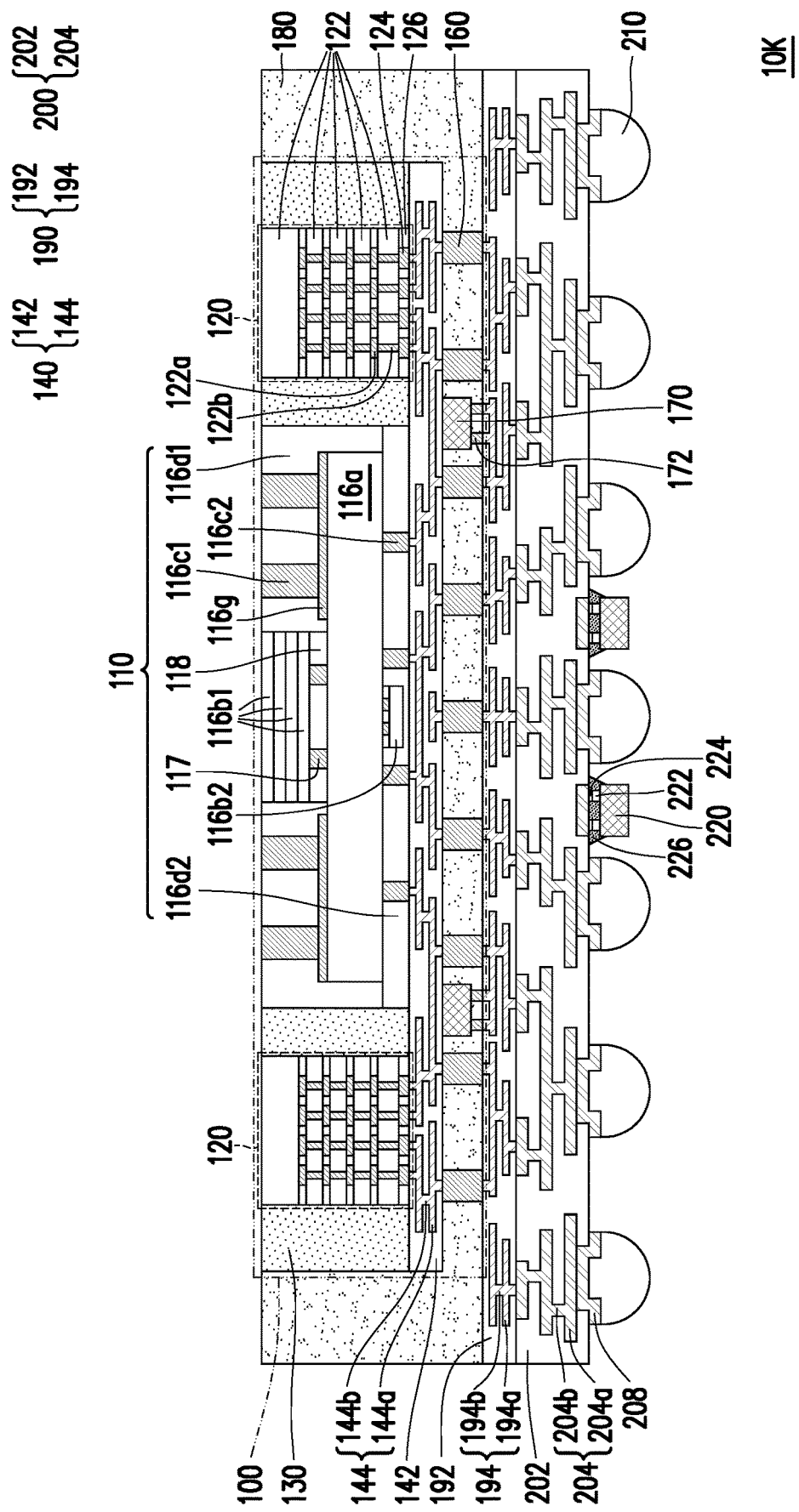
FIG. 7 is a cross-sectional view of an integrated circuit packages in accordance with some embodiments.

FIG. 7 is a cross-sectional view of an integrated circuit packages in accordance with some embodiments. The semiconductor package 10K illustrated in FIG. 7 is similar to the semiconductor package 10J illustrated in FIG. 6, hence the same reference numerals are used to refer to the same and liked parts, and its detailed description will be omitted herein. The difference between the semiconductor package 10K and the semiconductor package 10J is the structure of the integrated circuit 110. In detail, in the embodiment shown in FIG. 7, the integrated circuit 110 includes a first die 116a and a plurality of second dies 116b1, 116b2. In some embodiments, the second dies 116b1, 116b2 are bonded on opposite surfaces of the first die 116a and electrically connected to the first die 116a through a through silicon via (TSV) in the die 116a (not shown). In some embodiments, the second dies 116b1, 116b2 are bonded to the first die 116a through a plurality of connectors 117 and a dielectric layer 118 aside the connectors 117. The dimension of the first die 116a may be larger than the dimension of each of the second dies 116b1, 116b2. In some embodiments, the first die 116a is a logic die, and the second dies 116b1, 116b2 are memory dies. In some embodiments, the die circuits 110 is itself a SoIC die as described in the FIGS. 2A to 2I. In some embodiments, the first die 116a is itself a SoIC die as described in the FIG. 2A to 2I. In addition, the integrated circuit 120 may be memory die stacks, and includes a plurality of dies 122. Therefore, the second dies 116b1, 116b2 are disposed at opposite surfaces of the first die 116a in a first direction, and the dies 122 are disposed at opposite lateral sidewalls of the first die 116a in a second direction substantially perpendicular to the first direction. Accordingly, the die 116a such as a compute logic die is-immersed in the dies 116b1, 116b2, 122 such as memory dies. In above embodiments, one integrated circuit 110 is shown. However, the invention is not limited thereto. In some embodiments, there are multiple integrated circuits 110 as shown in FIG. 5.

In some embodiments, the integrated circuit 110 further includes a plurality of conductive pillars 116c1, 116c2 and a plurality of encapsulants 116d1, 116d2. In some embodiments, the conductive pillars 116c1 aside the second die 116b1 are thermal pillars for heat spreading, and the conductive pillars 116c2 aside the second die 116b2 are through vias for electrical connection. In some embodiments, the conductive pillars 116c1 are disposed on electrically connected to the first die 116a through a plurality of conductive layers 116g therebetween. In some embodiments, the conductive pillars 116c2 is electrically connected to the first die 116*a* and the redistribution layer structure 140. The encapsulant 116*d*1 encapsulates the first die 116*a*, the second die 116*b*2 and the conductive pillars 116*c*1. The encapsulant 116*d*2 encapsulates the second die 116*b*2 and the conductive pillars 116*c*2.

FIG. 8A to FIG. 8D are cross-sectional views of a method of forming an integrated circuit package in accordance with some embodiments.

Figure 8A:
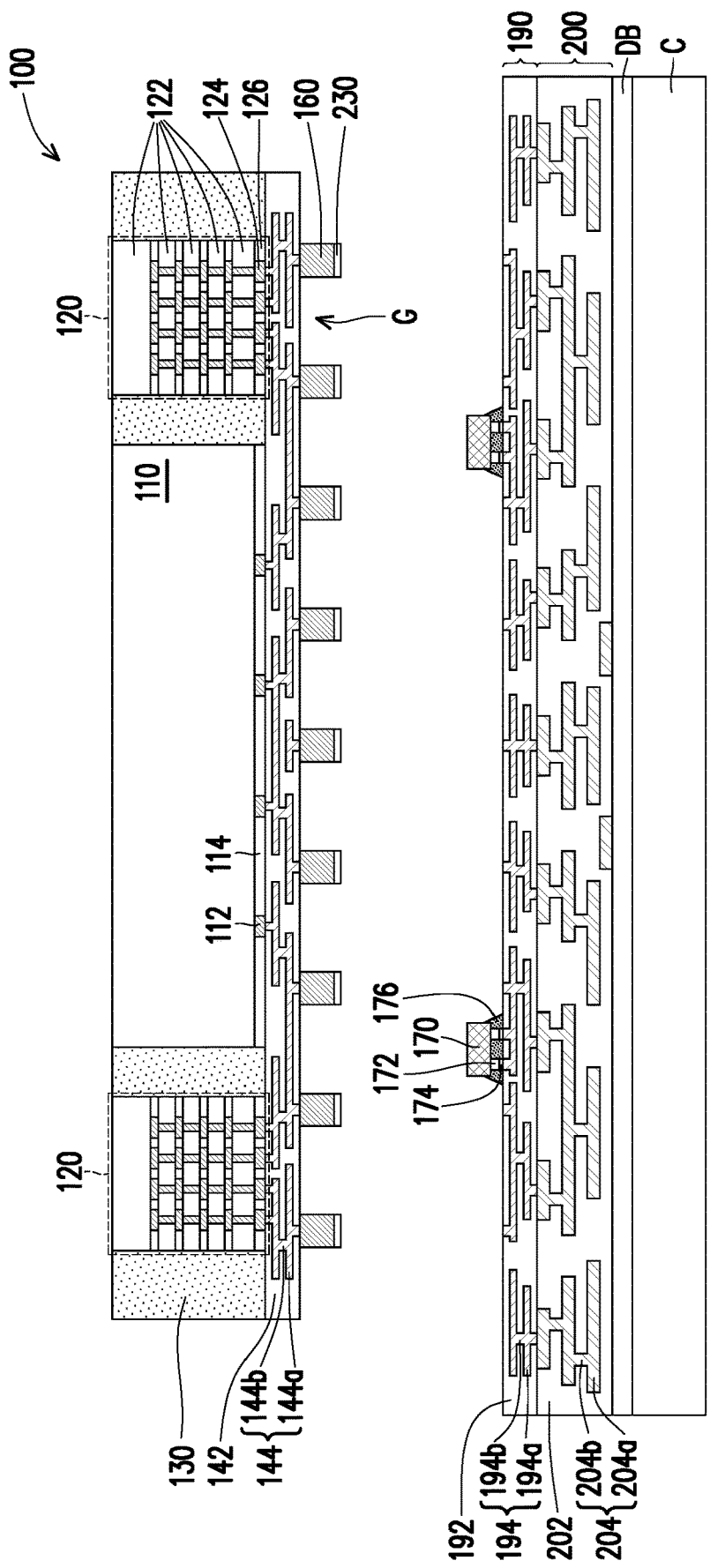
FIG. 8A to FIG. 8D are cross-sectional views of a method of forming an integrated circuit package in accordance with some embodiments.

Referring to FIG. 8A, a package structure 100 is provided. The package structure 100 may be any one of the package structures 100 of FIGS. 1, 2A-2I and 7 or the like. Then, a carrier substrate C with redistribution layer structures 190, 200 thereon is provided. In some embodiments, a de-bonding layer DB is formed over the carrier substrate C. Then, the redistribution layer structure 200 and the redistribution layer structure 190 are sequentially formed over the de-bonding layer DB. The configuration, material and forming method of the redistribution layer structures 190, 200 are similar to those of the redistribution layer structures 190, 200 in FIGS. 1E and 1F. In some embodiments, if required, the redistribution layer structure 190 is serializer/deserializer (SerDes) redistribution layer structure.

In some embodiments, after the redistribution layer structures 190, 200 are formed, a plurality of dies 170 are bonded onto the redistribution layer structure 190. The dies 170 are disposed corresponding to gaps G between adjacent conductive pillars 160, and thus after the dies 170 may be disposed between the adjacent conductive pillars 160 after the package structure 100 is bonded to the redistribution layer structure 190 over the carrier substrate C. In some embodiments, the dies 170 are mounted onto the redistribution layer structure 190 through connectors 172 of the dies 170 and solders 174 on the connectors 172. In some embodiments, an underfill 176 is provided between the die 170 and the redistribution layer structure 190 to seal the region therebetween. However, in some alternative embodiments, the die 170 is a bare (unpackaged) die.

Figure 8B:
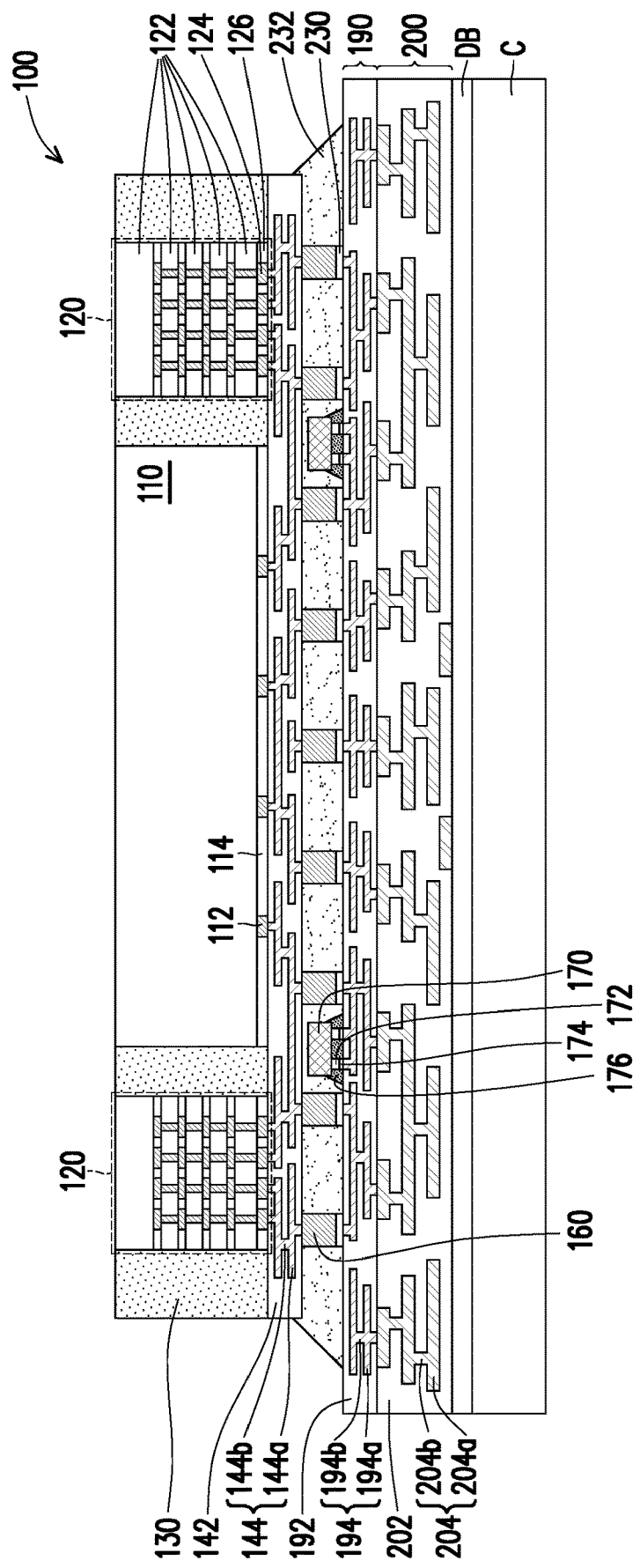

Referring to FIG. 8B, the package structure 100 is bonded to the redistribution layer structure 190 over the carrier substrate C. In some embodiments, the package structure 100 is flip-chip bonded to the redistribution layer structure 190 through the conductive pillars 160. In some embodiments, solder regions 230 are formed between the conductive pillars 160 and conductive features 194 of the redistribution layer structure 190. In some embodiments, as shown in FIG. 8A, the solders regions 230 are formed on the conductive pillars 160. However, in some alternative embodiments, the solders regions 230 are formed on the redistribution layer structure 190. After bonding, an underfill 232 (also referred to as an encapsulant) may be formed between the package structure 100 and the redistribution layer structure 190 to seal the region therebetween. In some embodiments, the dies 170 are embedded in the underfill 232 between the conductive pillars 160. In some embodiments, the dies 170 are physically separated from the redistribution layer structure 190. In some embodiments, the underfill 232 are disposed between the dies 170 and the redistribution layer structure 190.

Figure 8C:
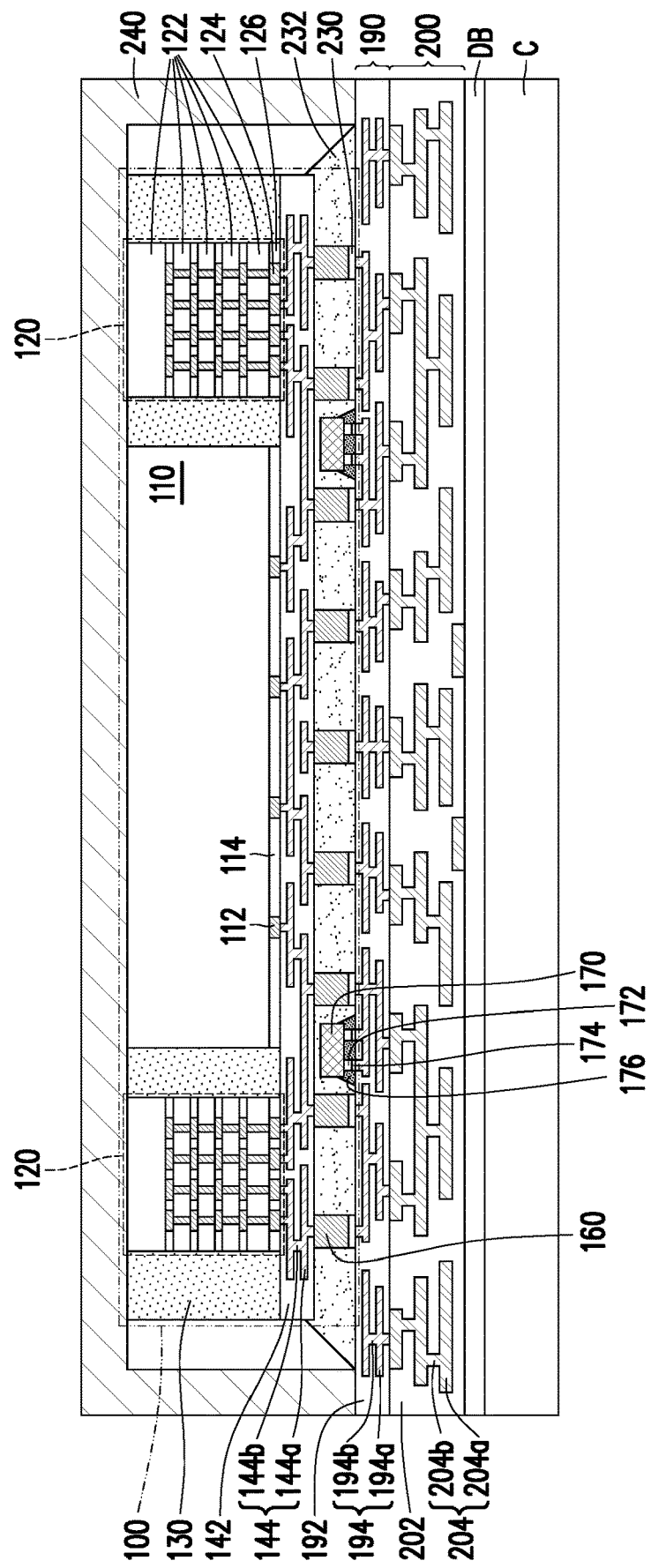

Referring to FIG. 8C, a heat sink 240 is formed over the package structure 100. In some embodiments, the heat sink 240 is a cover. In some embodiments, the heat sink 240 is disposed on a portion of the redistribution layer structure 190 exposed by the underfill 232, to cover the package structure 100 entirely. In some embodiments, the heat sink 240 is in contact with the portion of the redistribution layer structure 190. In some embodiments, the heat sink 240 is directly in contact with exposed surfaces of the package structure 100 such as surfaces of the integrated circuits 110, 120 and the encapsulant 130. In some alternative embodiments, the heat sink 240 is physically separated from and not in contact with the package structure 100.

Figure 8D:
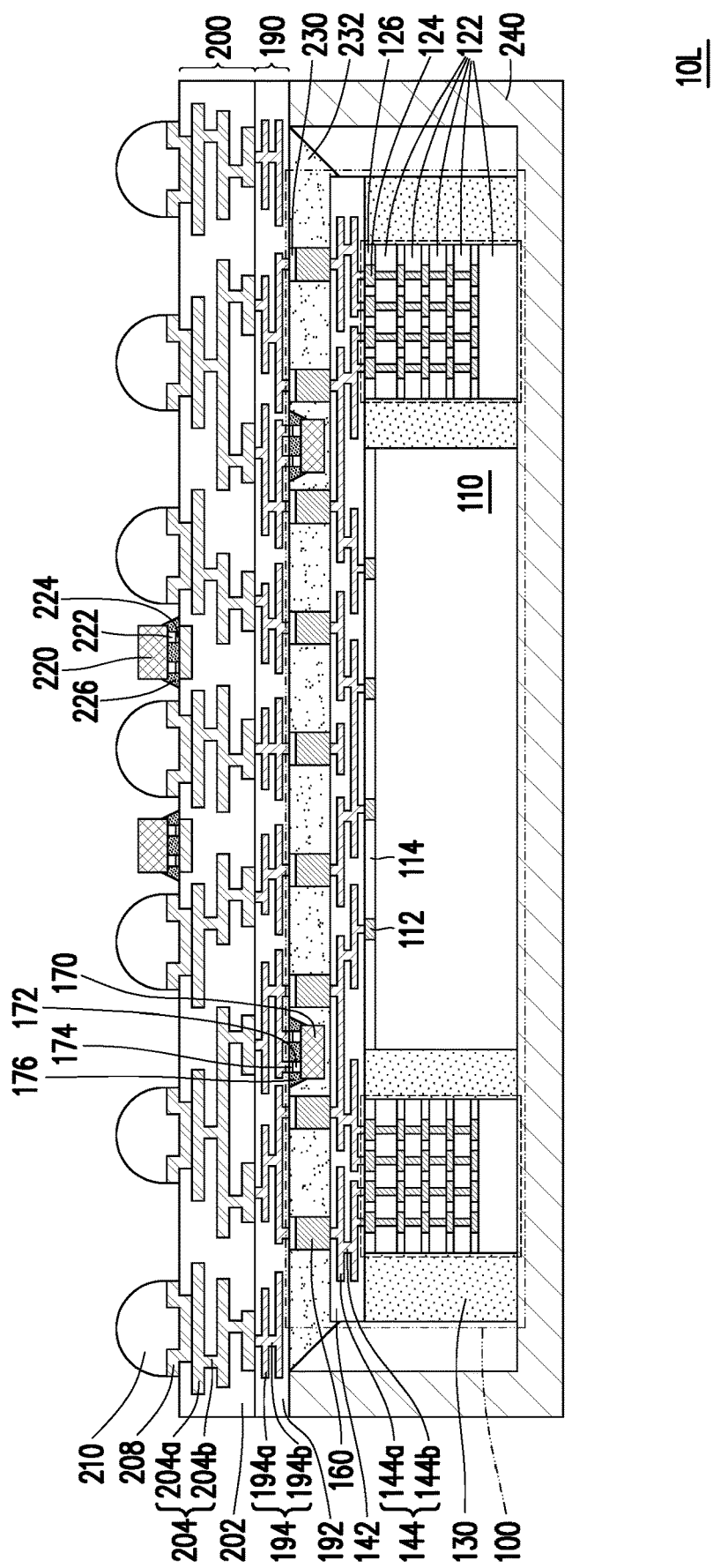

Referring to FIG. 8D, a structure of FIG. 8C is separated from the carrier substrate C. That is, the carrier substrate C and the de-bonding layer DB are removed. Then, the structure may be turned upside, and a plurality of conductive terminals 210 and a plurality of dies 220 may be formed over the redistribution layer structure 200, so as to electrically connect the redistribution layer structure 200. In some embodiments, the dies 220 are IPD dies, IVR dies, memory dies or the like. In some embodiments, a plurality of under-ball metallurgy (UBM) patterns 208 are formed under the conductive terminals 210 for ball mount. At this point, an integrated circuit package 10L is fabricated. In some embodiments, the die circuits 110 is itself a SoIC die as described in the FIGS. 2A to 2I.

In some embodiments, the package structure 100 is bonded to the redistribution layer structures 190, 200 through the conductive pillars 160. Thus, the die 170 may be disposed in the space formed between the conductive pillars 160. Accordingly, the additional space is not needed. In addition, since the carrier substrate C is directly used as a base layer for forming the redistribution layer structures 190, 200, a support substrate similar to a core layer may be omitted. In addition, since the carrier substrate C will be then removed, a total thickness of the integrated circuit package 10L is smaller than the integrated circuit package having the package structure bonded to the printed circuited board.

Figure 9:
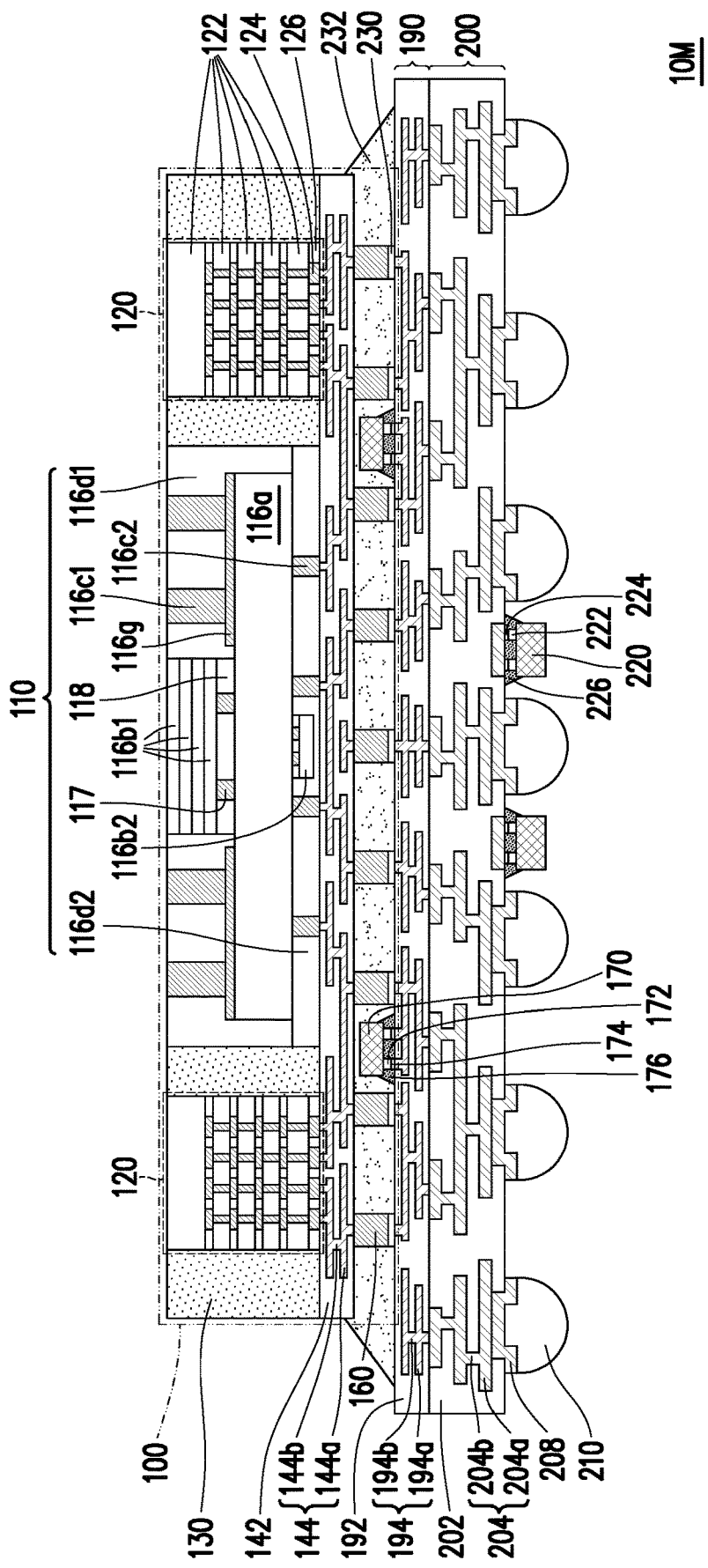
FIG. 9 is a cross-sectional view of an integrated circuit packages in accordance with some embodiments.

FIG. 9 is a cross-sectional view of an integrated circuit packages in accordance with some embodiments. The semiconductor package 10M illustrated in FIG. 9 is similar to the semiconductor package 10L illustrated in FIG. 8D, hence the same reference numerals are used to refer to the same and liked parts, and its detailed description will be omitted herein. The difference between the semiconductor package 10L and the semiconductor package 10M is the structure of the integrated circuit 110 and removal of the heat sink 240. In the embodiment shown in FIG. 9, the integrated circuit 110 has a structure similar to the integrated circuit 110 shown in FIG. 7. In some embodiments, the integrated circuits 110 is itself a SoIC die as described in the FIGS. 2A to 2I. In some embodiments, the first die 116*a* is itself a SoIC die as described in the FIGS. 2A to 2I. In some embodiments, the package structures 100 may include the substrate layer 150 interposed between the dies 170 and the integrated circuits 110 as illustrated in FIGS. 1A to 2I. In some embodiments, the package structure 100 and the dies 170 are bonded to the redistribution layer structure 190 through flip-chip bonding. In some alternative embodiments, a heat sink (not shown) is also disposed aside the package structure 100.

In some embodiments, the package structure is connected to the conductive terminals through the conductive pillars and the redistribution layer structures therebetween. The redistribution layer structures are directly formed over the package structure or the carrier substrate which is then removed, and thus the bonding of the package structure to an additional circuit board and the formation of additional bumps (such as C4 bumps) between the additional circuit board and the package structure are not required. In addition, the technique for manufacturing the PBC is applied in the fabrication of the redistribution layer structure having a large linewidth. Therefore, the strength of the redistribution layer structure is improved, and the cost and the time for manufacturing the redistribution layer structure may be reduced. Furthermore, the dies such as IPD and/or IVR may be disposed between the conductive pillars and embedded in the encapsulant, and thus the integration of the integrated circuit package is improved. Accordingly, the logic die and the memory dies (such as 3D memory cube) may be integrated side by side to realize in-memory computing (IMC) technology with high computing efficiency, high bandwidth and low latency.

Many variations of the above examples are contemplated by the present disclosure. It is understood that different embodiments may have different advantages, and that no particular advantage is necessarily required of all embodiments.

In accordance with some embodiments of the present disclosure, an integrated circuit package includes a plurality of integrated circuits, a first encapsulant, a first redistribution structure, a plurality of conductive pillars, a second redistribution structure, a second encapsulant and a third redistribution structure. The first encapsulant encapsulates the integrated circuits. The first redistribution structure is disposed over the first encapsulant and electrically connected to the integrated circuits. The conductive pillars are disposed over the first redistribution structure. The conductive pillars are disposed between and electrically connected to the first and second redistribution structures. The second encapsulant encapsulates the conductive pillars and is disposed between the first redistribution structure and second redistribution structure. The third redistribution structure is disposed over and electrically connected to the second redistribution structure, wherein a linewidth of the third redistribution structure is larger than a linewidth of the second redistribution structure.

In accordance with alternative embodiments of the present disclosure, an integrated circuit package includes a package structure, a second redistribution structure, at least one second die and a second encapsulant. The package structure includes a plurality of first dies, a first encapsulant encapsulating the first dies, a first redistribution structure over the first encapsulant and a plurality of conductive pillars over the first redistribution structure. The second redistribution structure is disposed over the package structure, and electrically connected to the package structure through the conductive pillars. The second die is disposed between the conductive pillars and electrically connected to the second redistribution structure. The second encapsulant encapsulates the conductive pillars and the at least one second die.

In accordance with yet alternative embodiments of the present disclosure, a method of manufacturing an integrated circuit package includes the following steps. A package structure is provided, and the package structure includes a plurality of first dies, a first encapsulant encapsulating the first dies, a first redistribution structure over the first encapsulant and a plurality of conductive pillars over the first redistribution structure. At least one second die is formed between the conductive pillars. A second encapsulant is formed to encapsulate the conductive pillars and the at least one second die. A second redistribution structure is formed over the second encapsulant. A third redistribution structure is formed, wherein a linewidth of the third redistribution structure is larger than a linewidth of the second redistribution structure. The package structure and the second redistribution structure are electrically connected, wherein the second redistribution structure is disposed between the package structure and the third redistribution structure.

In accordance with alternative embodiments of the present disclosure, an integrated circuit package includes a package structure including a plurality of first dies, a second redistribution structure, a second die and a second encapsulant. The package structure includes the first dies, a first encapsulant encapsulating the first dies, a first redistribution structure over the first encapsulant and a plurality of conductive pillars over the first redistribution structure. The second redistribution structure is disposed over the package structure, and electrically connected to the package structure through the conductive pillars. The second die is disposed between the conductive pillars and electrically connected to the second redistribution structure, wherein a first surface of the second die is substantially flush with a surface of the first redistribution structure and a second surface opposite to the first surface of the second die is substantially flush with a surface of the second redistribution structure. The second encapsulant encapsulates the conductive pillars and the second die.

In accordance with alternative embodiments of the present disclosure, an integrated circuit package includes a first redistribution structure, a second redistribution structure, a semiconductor layer, a plurality of conductive pillars and a first die. The semiconductor layer is disposed between the first redistribution structure and the second redistribution structure. The conductive pillars are disposed on the semiconductor layer and penetrate through the semiconductor layer, wherein the conductive pillars are disposed between and electrically connected to the first redistribution structure and the second redistribution structure. The first die is disposed on the semiconductor layer between the first redistribution structure and the second redistribution structure.

In accordance with alternative embodiments of the present disclosure, a method of manufacturing an integrated circuit package includes the following steps. A semiconductor layer is formed on a first redistribution structure. A plurality of conductive pillars are formed in the semiconductor layer to electrically connect to the first redistribution structure. A first die is formed on the semiconductor layer between the conductive pillars. A second redistribution structure is formed on the semiconductor layer to electrically connect to the first die and the conductive pillars.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package, comprising:
   a package structure, comprising a plurality of first dies, a first encapsulant encapsulating the first dies, a first redistribution structure over the first encapsulant and a plurality of conductive pillars over the first redistribution structure;
   a second redistribution structure, disposed over the package structure, and electrically connected to the package structure through the conductive pillars;
   a second die, disposed between the conductive pillars and electrically connected to the second redistribution structure, wherein a first surface of the second die is substantially flush with a surface of the first redistribution structure and a second surface opposite to the first surface of the second die is substantially flush with a surface of the second redistribution structure; and
   a second encapsulant, encapsulating the conductive pillars and the second die, wherein the second die comprises a plurality of connectors electrically connected to the second redistribution structure, and the second encapsulant is disposed between the connectors.

2. The integrated circuit package according to claim 1, wherein the second die is an integrated voltage regulator die or an integrated passive device die.

3. The integrated circuit package according to claim 1, wherein the second die comprises a die attach film and is adhered to the first redistribution structure through the die attach film.

4. The integrated circuit package according to claim 1, wherein the second die is disposed between two adjacent ones of the conductive pillars.

5. The integrated circuit package according to claim 1, wherein the second encapsulant further encapsulates lateral sidewalls of the first redistribution structure and the first encapsulant.

6. The integrated circuit package according to claim 1, wherein the second encapsulant further encapsulates a sidewall of the first redistribution structure and is disposed between the second die and one of the conductive pillars.

7. An integrated circuit package, comprising:
   a first redistribution structure and a second redistribution structure;
   a semiconductor layer between the first redistribution structure and the second redistribution structure;
   a plurality of conductive pillars disposed on the semiconductor layer and penetrating through the semiconductor layer, wherein the conductive pillars are disposed between and electrically connected to the first redistribution structure and the second redistribution structure; and
   a first die, wherein the first die is disposed on the semiconductor layer between the first redistribution structure and the second redistribution structure.

8. The integrated circuit package according to claim 7 further comprising a first encapsulant between the first redistribution structure and the second redistribution structure, wherein the first encapsulant encapsulates the conductive pillars and the first die.

9. The integrated circuit package according to claim 8, wherein the first encapsulant further encapsulates sidewalls of the semiconductor layer and the first redistribution structure.

10. The integrated circuit package according to claim 7, wherein sidewalls of the semiconductor layer are substantially flush with sidewalls of the first redistribution structure.

11. The integrated circuit package according to claim 7, wherein a surface of the first die is substantially coplanar with surfaces of the conductive pillars and a surface of the second redistribution structure.

12. The integrated circuit package according to claim 7 further comprising an adhesive layer between the first die and the semiconductor layer, wherein the first die is electrically connected to the first redistribution structure through the second redistribution structure and at least one of the conductive pillars.

13. The integrated circuit package according to claim 7 further comprising a plurality of second dies and a first encapsulant encapsulating the second dies, wherein the first redistribution structure is disposed between the second dies and the semiconductor layer.

14. The integrated circuit package according to claim 13, wherein sidewalls of the semiconductor layer are substantially flush with sidewalls of the first redistribution structure and the first encapsulant.

15. The integrated circuit package according to claim 14 further comprising a second encapsulant encapsulating the conductive pillars, the first die, the semiconductor layer and the first encapsulant.

16. A method of manufacturing an integrated circuit package, comprising:
   forming a semiconductor layer on a first redistribution structure;
   forming a plurality of conductive pillars in the semiconductor layer to electrically connect to the first redistribution structure;
   forming a first die on the semiconductor layer between the conductive pillars; and
   forming a second redistribution structure on the semiconductor layer to electrically connect to the first die and the conductive pillars.

17. The method according to claim 16 further comprising forming a first encapsulant between the conductive pillars on the semiconductor layer.

18. The method according to claim 17, wherein the first encapsulant further encapsulates the semiconductor layer and the first redistribution structure.

19. The method according to claim 16, wherein the first die is disposed on the semiconductor layer through an adhesive layer.

20. The method according to claim 16, wherein a surface of the first die is substantially coplanar with surfaces of the conductive pillars.

* * * * *